US012813081B2

(12) United States Patent
Tak et al.

(10) Patent No.: US 12,813,081 B2
(45) Date of Patent: Nov. 24, 2026

(54) DISPLAY APPARATUS HAVING PERIPHERAL BANK AND LIGHT-BLOCKING MATERIAL LAYER

(71) Applicant: Samsung Display Co., Ltd., Yongin-si (KR)

(72) Inventors: Kyungseon Tak, Yongin-si (KR); Yunhee Park, Yongin-si (KR); Yiseop Shim, Yongin-si (KR); Hyunseung Lee, Yongin-si (KR); Hyelim Jang, Yongin-si (KR); Kyuwon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 358 days.

(21) Appl. No.: 18/405,351

(22) Filed: Jan. 5, 2024

(65) Prior Publication Data

US 2024/0324298 A1 Sep. 26, 2024

(30) Foreign Application Priority Data

Mar. 24, 2023 (KR) ........................ 10-2023-0039122
Jun. 23, 2023 (KR) ........................ 10-2023-0081337

(51) Int. Cl.
*H10K 59/122* (2023.01)
*H10K 59/80* (2023.01)
*H10K 77/10* (2023.01)

(52) U.S. Cl.
CPC ......... *H10K 59/122* (2023.02); *H10K 59/874* (2023.02); *H10K 59/8792* (2023.02); *H10K 77/111* (2023.02)

(58) Field of Classification Search
CPC .. H10K 77/111; H10K 59/8792; H10K 59/40; H10K 59/122
See application file for complete search history.

(56) References Cited

U.S. PATENT DOCUMENTS 10,971,557 B2 4/2021 Jeong et al.
11,537,226 B2 12/2022 Lee et al.
(Continued)

FOREIGN PATENT DOCUMENTS

KR 10-0470022 2/2005
KR 10-2021-0083005 7/2021
(Continued)

*Primary Examiner* — Changhyun Yi
(74) *Attorney, Agent, or Firm* — Womble Bond Dickinson (US) LLP

(57) ABSTRACT

The display apparatus includes a substrate including a display area and a peripheral area, wherein the peripheral area includes a bending area, at least one inorganic material layer disposed on the substrate, at least one organic material layer disposed on the at least one inorganic material layer, a touch electrode layer disposed on the at least one organic material layer, the touch layer may include a plurality of touch electrodes arranged in the peripheral area, at least one bank disposed on the at least one inorganic material layer, the at least one bank arranged between the bending area and the display area in a plan view, and a light-blocking material layer disposed on the touch electrode layer, wherein an end of the light-blocking material layer may be arranged between the at least one bank and the plurality of touch electrodes in a plan view.

20 Claims, 15 Drawing Sheets

(56) References Cited

U.S. PATENT DOCUMENTS

| | | | | |
|---|---|---|---|---|
| 2019/0326361 | A1* | 10/2019 | Gwon | H10K 59/8731 |
| 2021/0056282 | A1* | 2/2021 | Kim | G02F 1/136 |
| 2022/0131113 | A1 | 4/2022 | Jung et al. | |
| 2022/0415980 | A1 | 12/2022 | Lee et al. | |
| 2023/0209967 | A1* | 6/2023 | Won | G06F 3/0412<br>345/174 |

FOREIGN PATENT DOCUMENTS

| | | |
|---|---|---|
| KR | 10-2022-0006137 | 1/2022 |
| KR | 10-2022-0056284 | 5/2022 |
| KR | 10-2023-0004972 | 1/2023 |

* cited by examiner $H_2O + O_2 + {}^{*}M^{+}X^{-}$ $M \rightarrow M^{2}+ + 2e^{-}$ $2H_2O + O_2 + 4e^{-} \rightarrow 4(OH^{-})$ $M^{2}+ + 2OH^{-} \text{ or } X^{-} \rightarrow M(OH)_2 \text{ or } MX_2$

DISPLAY APPARATUS HAVING PERIPHERAL BANK AND LIGHT-BLOCKING MATERIAL LAYER

CROSS-REFERENCE TO RELATED APPLICATIONS

This application claims priority under 35 U.S.C. § 119 from Korean Patent Application Nos. 10-2023-0039122 filed on Mar. 24, 2023, and 10-2023-0081337, filed on Jun. 23, 2023 in the Korean Intellectual Property Office, the entire contents of which are incorporated herein by reference.

BACKGROUND

1. Technical Field

One or more embodiments relate to a display apparatus wherein corrosion occurring in a bending area may be reduced or prevented.

2. Description of the Related Art

A display apparatus may be configured to receive information regarding images and display images. A display apparatus may be used as a display of miniaturized products such as mobile phones, or used as a display of large-scale products such as televisions.

A display apparatus includes multiple pixels that receive electrical signals and emit light to display images to the outside. Each pixel includes a light-emitting element. As an example, an organic light-emitting display apparatus includes an organic light-emitting diode (OLED) as a light-emitting element. Generally, an organic light-emitting display apparatus includes a thin-film transistor and an OLED over a substrate, and operates while the OLED emits light spontaneously.

The display apparatus is required to have high reliability even in a bending area even under high temperature/high humidity conditions.

SUMMARY

One or more embodiments include a display apparatus, wherein corrosion occurring in a bending area may be reduced or prevented. However, such a technical objective may be just an example, and the disclosure may not be limited thereto.

Additional aspects will be set forth in part in the description which follows and, in part, will be apparent from the description, or may be learned by practice of the presented embodiments of the disclosure.

According to one or more embodiments, a display apparatus may include a substrate including a display area and a peripheral area disposed around the display area, wherein the peripheral area includes a bending area that may be bent around a bending axis, at least one inorganic material layer disposed on the substrate, at least one organic material layer disposed on the at least one inorganic material layer, a touch electrode layer disposed on the at least one organic material layer, the touch electrode layer may include a plurality of touch electrodes arranged in the peripheral area, at least one bank disposed on the at least one inorganic material layer, the at least one bank may be arranged between the bending area and the display area in a plan view, and a light-blocking material layer disposed on the touch electrode layer, the light-blocking layer may have an end disposed between the at least one bank and the plurality of touch electrodes in a plan view.

The at least one bank may include a first bank arranged between the bending area and the plurality of touch electrodes in a plan view, and a second bank arranged between the first bank and the plurality of touch electrodes in a plan view, wherein the second bank may be apart from the first bank.

The end of the light-blocking material layer may be arranged between the first bank and the second bank in a plan view.

The light-blocking material layer may cover the plurality of touch electrodes in a plan view.

The at least one bank may further include a third bank arranged between the second bank and the plurality of touch electrodes, the third bank may be apart from the second bank in a plan view.

The end of the light-blocking material layer may be arranged between the second bank and the third bank in a plan view.

The light-blocking material layer may overlap the plurality of touch electrodes in a plan view.

In a plan view, a distance between an inner surface of the bending area and the end of the light-blocking material layer may be in a range of about 400 μm to about 750 μm.

The display apparatus may further include an outer bank arranged in the bending area, the outer bank may fill an opening disposed in the bending area in a plan view, and the outer bank may include an organic material.

The light-blocking material layer may include a water-soluble salt.

The water-soluble salt may include at least one of sodium, potassium, magnesium, manganese, aluminum, and calcium.

The at least one organic material layer may include a first organic insulating layer disposed on the at least one inorganic material layer, a second organic insulating layer disposed on the first organic insulating layer, and a pixel-defining layer disposed on the second organic insulating layer.

The at least one bank may include a first bank arranged between the bending area and the plurality of touch electrodes in a plan view, and a second bank arranged between the first bank and the plurality of touch electrodes in a plan view, wherein the first bank may include a (1-1)st sub-bank disposed on the at least one inorganic material layer, the (1-1)st sub-bank and the first organic insulating layer may include a same material, a (1-2)nd sub-bank disposed on the (1-1)st sub-bank, the (1-2)nd sub-bank and the second organic insulating layer may include a same material, and a (1-3)rd sub-bank disposed on the (1-2)nd sub-bank, the (1-3)rd sub-bank and the pixel-defining layer may include a same material.

The second bank may include a (2-1)st sub-bank disposed on the at least one inorganic material layer, the (2-1)st sub-bank and the second organic insulating layer may include a same material, and a (2-2)nd sub-bank disposed on the (2-1)st sub-bank, the (2-2)nd sub-bank and the pixel-defining layer may include a same material.

According to one or more embodiments, a display apparatus may include a substrate including a display area and a peripheral area disposed around the display area, wherein the peripheral area includes a bending area that may be bent about a bending axis, a plurality of inorganic material layers disposed on the substrate, the plurality of inorganic material layers may include a plurality of openings each arranged in the bending area and exposing an upper surface of the substrate, a plurality of organic material layers disposed on the plurality of inorganic material layers, the plurality of organic material layers may include a plurality of ends each arranged between the bending area and the display area in a plan view, a touch electrode layer disposed on the plurality of organic material layers, the touch electrode may include a plurality of touch electrodes disposed in the peripheral area, an outer bank arranged in the bending area in a plan view, the outer bank may include an organic material, wherein a portion of the outer bank may fill the plurality of openings, a first bank disposed on the plurality of inorganic material layers and arranged between the bending area and the display area in a plan view, a second bank arranged between the first bank and the display area and apart from the first bank in a plan view, and a light-blocking material layer disposed on the touch electrode layer, the light-blocking material layer may have a portion of an edge thereof arranged between the first bank and the display area in a plan view, wherein a lateral surface of the outer bank and a lateral surface of the first bank may be arranged to face each other and define a first valley structure, another lateral surface of the first bank and a lateral surface of the second bank may be arranged to face each other and define a second valley structure, a portion of the edge of the light-blocking material layer may overlap the second valley structure in a plan view.

The light-blocking material layer may cover the plurality of touch electrodes in a plan view.

The light-blocking material layer may include a water-soluble salt.

The water-soluble salt may include at least one of sodium, potassium, magnesium, manganese, aluminum, and calcium.

According to one or more embodiments, a display apparatus may include a substrate including a display area and a peripheral area disposed around the display area, wherein the peripheral area includes a bending area that may be bent about a bending axis, a plurality of inorganic material layers disposed on the substrate, the plurality of inorganic material layers may include a plurality of openings each arranged in the bending area and exposing an upper surface of the substrate, a plurality of organic material layers disposed on the plurality of inorganic material layers, the plurality of organic material layers may include a plurality of ends each arranged between the bending area and the display area in a plan view, a touch electrode layer disposed on the plurality of organic material layers, the touch electrode layer may include a plurality of touch electrodes, an outer bank arranged in the bending area in a plan view, the outer bank may include an organic material, wherein a portion of the outer bank may fill the plurality of openings, a first bank disposed on the plurality of inorganic material layers and arranged between the bending area and the display area in a plan view, a second bank arranged between the first bank and the display area and apart from the first bank, a third bank arranged between the second bank and the display area and apart from the second bank, and a light-blocking material layer disposed on the touch electrode layer and arranged between the second bank and the display area in a plan view, wherein a lateral surface of the outer bank and a lateral surface of the first bank may be arranged to face each other and define a first valley structure, another lateral surface of the first bank and a lateral surface of the second bank may be arranged to face each other and define a second valley structure, and another lateral surface of the second bank and a lateral surface of the third bank may be arranged to face each other and define a third valley structure, wherein an end of the light-blocking material layer may overlap the third valley structure in a plan view.

The light-blocking material layer may cover the plurality of touch electrodes in a plan view.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
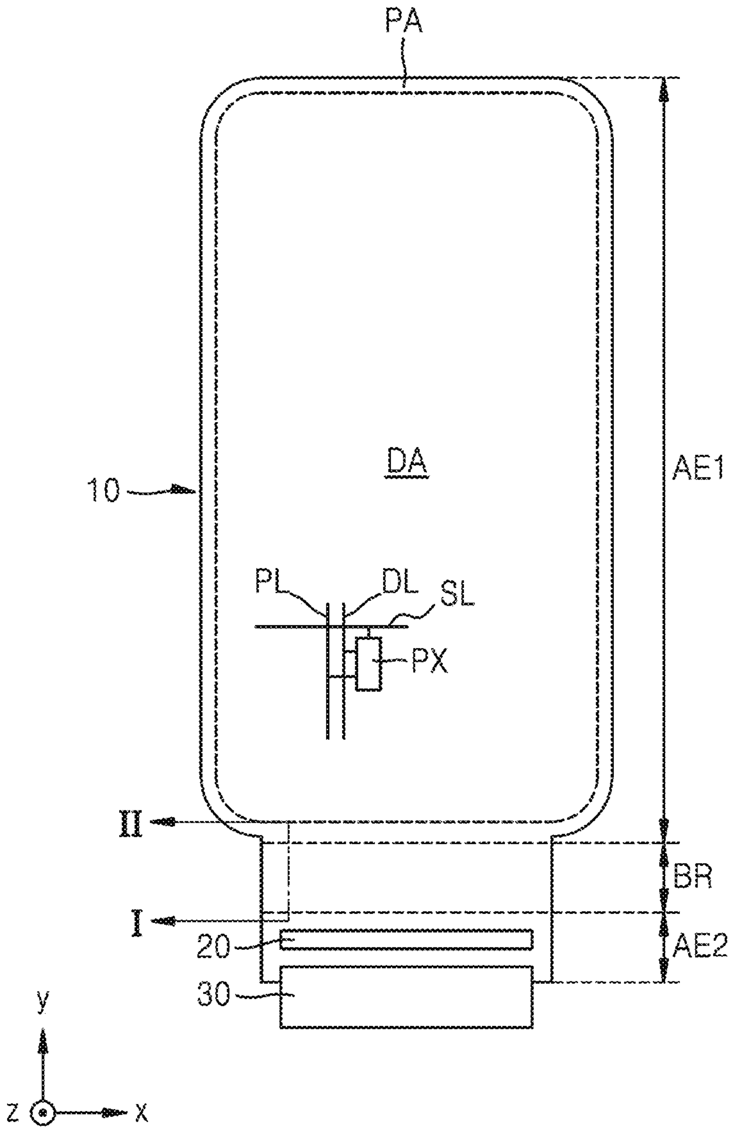
FIG. 1 is a schematic plan view of a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Hereinafter, a display apparatus according to an embodiment is described in detail.

Figure 2:
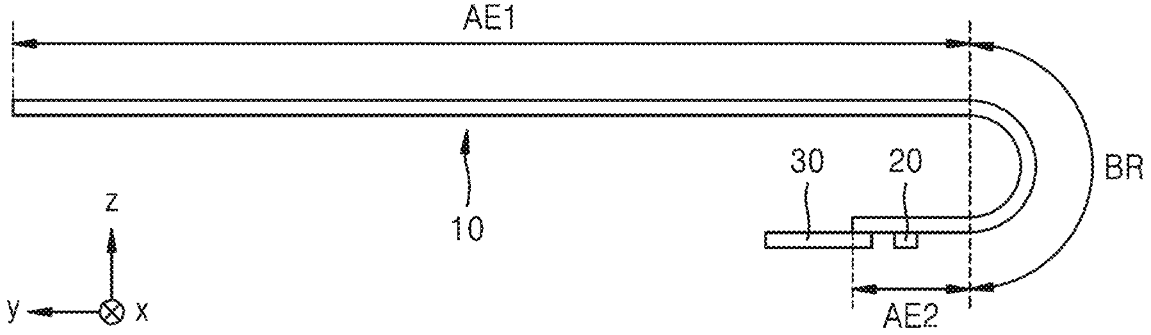
FIG. 2 is a schematic side view of an example of the display apparatus of FIG. 1 being bent.

FIG. 1 is a schematic plan view of a display apparatus according to an embodiment, and FIG. 2 is a schematic side view of an example of the display apparatus of FIG. 1 that may be bent.

As shown in FIGS. 1 and 2, as long as a display apparatus includes a display panel, any display apparatus may be used as the display apparatus according to an embodiment. As an example, the display apparatus may include various products such as smartphones, tablet computers, laptop computers, televisions, advertisement boards, or the like.

The display panel 10 includes a display area DA and a peripheral area PA outside the display area DA. The display area DA may be a portion configured to display images, and multiple pixels PX may be arranged in the display area DA. In case that viewed in a direction approximately perpendicular to the display panel, the display area DA may have various shapes, for example, a circular shape, an elliptical shape, a polygon, the shape of a specific figure, and the like. It may be shown in FIG. 1 that the display area DA has an approximately rectangular shape having round corners.

The peripheral area PA may be arranged outside the display area DA. The width (in an x axis direction) of a portion of the peripheral area PA may be less than the width (in the x axis direction) of the display area DA. Through this structure, as described below, a portion of the peripheral area PA may be readily bent.

Because the display panel 10 includes a substrate 100 described below, it may be understood that the substrate 100 includes the display area DA and the peripheral area PA described above. Hereinafter, for convenience, description is made on the assumption that the substrate 100 includes the display area DA and the peripheral area PA.

The display panel 10 may also include a main area AE1, a bending area BR outside the main area AE1, and a sub-area AE2 arranged opposite the main area AE1 around the bending area BR. As shown in FIG. 2, bending of the display panel 10 may be performed in the bending area BR, and thus, a portion of the sub-area AE2 may overlap the main area AE1 in case that viewed in a z axis direction. The embodiment may not be limited to the display apparatus that is bent and may be applicable to a display apparatus that is not bent. The sub-area AE2 may be a non-display area or may include a region including the non-display area. Because the display panel may be bent in the bending area BR, the non-display area may not be viewed or the area of the non-display area may be reduced even though the non-display area may be recognized in case that the display apparatus is viewed from the front surface thereof (in a −z direction).

A driving chip 20 may be arranged in the sub-area AE2 of the display panel. The driving chip 20 may include an integrated circuit configured to drive the display panel. Although the integrated circuit may be a data driving integrated circuit configured to generate data signals, the embodiment may not be limited thereto.

The driving chip 20 may be mounted in the sub-area AE2 of the display panel. Although the driving chip 20 may be mounted on a surface same as a display surface in the display area DA, because the display panel may be bent in the bending area BR, the driving chip 20 may be arranged on a rear surface of the main area AE1 as described above.

A printed circuit board 30 and the like may be attached to the end of the sub-area AE2 of the display panel. The printed circuit board 30 and the like may be electrically connected to the driving chip 20 and the like through a pad (not shown) on the substrate.

Hereinafter, although an organic light-emitting display apparatus may be described as an example of the display apparatus according to an embodiment, the display apparatus may not be limited thereto. In an embodiment, the display apparatus according to an embodiment may be an inorganic light-emitting display apparatus or a quantum-dot light-emitting display apparatus. As an example, an emission layer of a display element of the display apparatus may include an organic material or an inorganic material. In addition, the display apparatus may include an emission layer and a quantum-dot layer located on a path of light emitted from the emission layer.

The display area DA may be a region in which images are displayed, and multiple main pixels PX may be arranged in the display area DA. Each main pixel PX may include a display element such as an organic light-emitting diode. Each main pixel PX may be configured to emit, for example, red, green, or blue light. The main pixel PX may be electrically connected to a pixel circuit PC including a thin-film transistor TFT, a storage capacitor, and the like. The pixel circuit PC may be electrically connected to a scan line SL, a data line DL, and a driving voltage line PL, wherein the scan line SL may be configured to transfer scan signals, the data line DL crosses the scan line SL and may be configured to transfer data signals, and the driving voltage line PL may be configured to supply a driving voltage. The scan line SL may extend in an x direction, the data line DL and the driving voltage line PL may extend in a y direction.

The main pixel PX may be configured to emit light of a brightness corresponding to an electrical signal from the pixel circuit PC electrically connected thereto. The display area DA may be configured to display preset images by using light emitted from the main pixel PX. For reference, as described above, the main pixel PX may be defined as an emission area that may be configured to emit light having one of red, green, and blue.

Multiple main pixels PX may be electrically connected to outer circuits arranged in the peripheral area PA. A scan driving circuit, an emission control driving circuit, a terminal, a driving power supply line, an electrode power supply line and the like may be arranged in the peripheral area PA. The scan driving circuit may be configured to provide scan signals to the pixel PX through the scan line SL. The emission control driving circuit may be configured to provide emission control signals to the pixel PX through an emission control line EL. The terminal arranged in the peripheral area PA may be exposed and electrically connected to the printed circuit board 30 by not being covered by an insulating layer. The printed circuit board 30 may be electrically connected to the terminal of the display panel.

Figure 3:
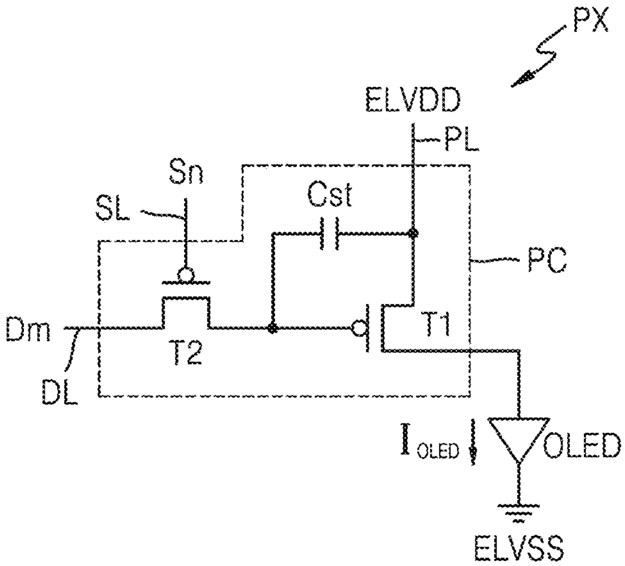
FIGS. 3 and 4 are schematic diagrams of equivalent circuits of a pixel of a display apparatus according to an embodiment.
Figure 4:
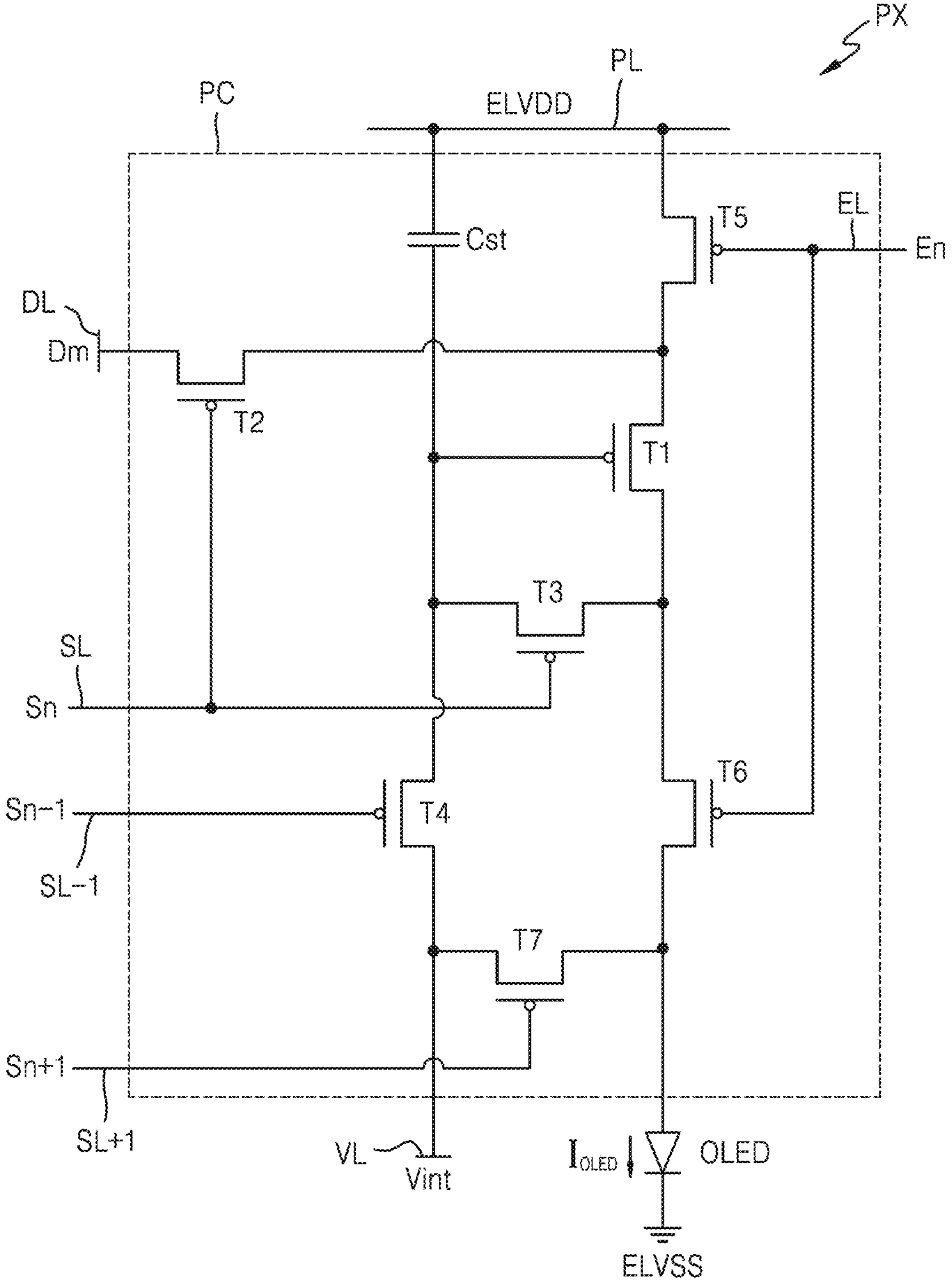

FIGS. 3 and 4 are schematic diagrams of equivalent circuits of pixels of a display apparatus according to an embodiment.

As shown in FIG. 3, the pixel circuit PC may be electrically connected to a display element OLED to implement light emission of the pixels PX. The pixel circuit PC includes a driving thin-film transistor T1, a switching thin-film transistor T2, and a storage capacitor Cst. The switching thin-film transistor T2 may be electrically connected to the scan line SL and the data line DL, and configured to transfer a data signal Dm to the driving thin-film transistor T1 according to a scan signal Sn, wherein the data signal Dm may be input through the data line DL, and the scan signal Sn may be input through the scan line SL.

The storage capacitor Cst may be electrically connected to the switching thin-film transistor T2 and the driving voltage line PL and configured to store a voltage corresponding to a difference between a voltage transferred from the switching thin-film transistor T2 and a driving voltage ELVDD supplied to the driving voltage line PL.

The driving thin-film transistor T1 may be electrically connected to the driving voltage line PL and the storage capacitor Cst and configured to control a driving current $I_{OLED}$ according to the voltage stored in the storage capacitor Cst, the driving current flowing from the driving voltage line PL to the display element OLED. The display element OLED may be configured to emit light having a preset brightness based on the driving current.

Referring to FIG. 4, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

Although FIG. 4 shows the case where each pixel circuit PC includes signal lines SL, SL−1, SL+1, EL, and DL, an initialization voltage line VL, and the driving voltage line PL, the embodiment may not be limited thereto. In an embodiment, at least one of the signal lines SL, SL−1, SL+1, EL, and DL, and/or the initialization voltage line VL may be shared by adjacent pixel circuits.

A drain electrode of the driving thin-film transistor T1 may be electrically connected to the display element OLED through the emission control thin-film transistor T6. The driving thin-film transistor T1 may be configured to receive a data signal Dm and supply the driving current to the display element OLED according to a switching operation of the switching thin-film transistor T2.

A gate electrode of the switching thin-film transistor T2 may be electrically connected to the scan line SL, and a source electrode may be electrically connected to the data line DL. A drain electrode of the switching thin-film transistor T2 may be electrically connected to a source electrode of the driving thin-film transistor T1, and electrically connected to the driving voltage line PL through the operation control thin-film transistor T5.

The switching thin-film transistor T2 may be turned on according to a scan signal Sn transferred through the scan line SL and performs a switching operation of transferring a data signal Dm to a source electrode of the driving thin-film transistor T1, wherein the data signal Dm may be transferred to the data line DL.

A gate electrode of the compensation thin-film transistor T3 may be electrically connected to the scan line SL. A source electrode of the compensation thin-film transistor T3 may be electrically connected to a drain electrode of the driving thin-film transistor T1 and electrically connected to a pixel electrode of the display element OLED through the emission control thin-film transistor T6. A drain electrode of the compensation thin-film transistor T3 may be electrically connected to one of electrodes of the storage capacitor Cst, a source electrode of the first initialization thin-film transistor T4, and a gate electrode of the driving thin-film transistor T1 together. The compensation thin-film transistor T3 may be turned on according to a scan signal Sn received through the scan line SL and diode-connects the driving thin-film transistor T1 by connecting the gate electrode and the drain electrode of the driving thin-film transistor T1 to each other.

A gate electrode of the first initialization transistor T4 may be electrically connected to a previous scan line SL−1. A drain electrode of the first initialization transistor T4 may be electrically connected to the initialization voltage line VL. A source electrode of the first initialization thin-film transistor T4 may be electrically connected to one of the electrodes of the storage capacitor Cst, a drain electrode of the compensation thin-film transistor T3, and the gate electrode of the driving thin-film transistor T1 together. For example, the first initialization thin-film transistor T4 may be turned on according to a previous scan signal Sn−1 received through the previous scan line SL−1 and may perform an initialization operation of initializing the voltage of the gate electrode of the driving thin-film transistor T1 by transferring an initialization voltage Vint to the gate electrode of the driving thin-film transistor T1.

A gate electrode of the operation control thin-film transistor T5 may be electrically connected to the emission control line EL. A source electrode of the operation control thin-film transistor T5 may be electrically connected to the driving voltage line PL. A drain electrode of the operation control thin-film transistor T5 may be electrically connected to the source electrode of the driving thin-film transistor T1 and the drain electrode of the switching thin-film transistor T2.

A gate electrode of the emission control thin-film transistor T6 may be electrically connected to the emission control line EL. A source electrode of the emission control thin-film transistor T6 may be electrically connected to the drain electrode of the driving thin-film transistor T1 and the source electrode of the compensation thin-film transistor T3. A drain electrode of the emission control thin-film transistor T6 may be electrically connected to the pixel electrode of the display element OLED. The operation control thin-film transistor T5 and the emission control thin-film transistor T6 may be simultaneously turned on according to an emission control signal En transferred through the emission control line EL, the driving voltage ELVDD may be transferred to the display element OLED, and the driving current flows through the display element OLED.

A gate electrode of the second initialization thin-film transistor T7 may be electrically connected to the next scan line SL+1. A source electrode of the second initialization thin-film transistor T7 may be electrically connected to the pixel electrode of the display element OLED. A drain electrode of the second initialization thin-film transistor T7 may be electrically connected to the initialization voltage line VL. The second initialization thin-film transistor T7 may be turned on according to a next scan signal Sn+1 transferred through the next scan line SL+1 to initialize the pixel electrode of the display element OLED.

Although it is shown in FIG. 4 that the first initialization thin-film transistor T4 and the second initialization thin-film transistor T7 may be respectively electrically connected to the previous scan line SL−1 and the next scan line SL+1, the embodiment may not be limited thereto. In an embodiment, both the first initialization thin-film transistor T4 and the second initialization thin-film transistor T7 may be electrically connected to the previous scan line SL−1 and thus driven according to a previous scan signal Sn−1.

Another electrode of the storage capacitor Cst may be electrically connected to the driving voltage line PL. One of the electrodes of the storage capacitor Cst may be electrically connected to the gate electrode of the driving thin-film transistor T1, the drain electrode of the compensation thin-film transistor T3, and the source electrode of the first initialization thin-film transistor T4 together.

An opposite electrode (e.g., a cathode) of the display element OLED may be configured to receive a common voltage ELVSS. The display element OLED may be configured to emit light by receiving the driving current from the driving thin-film transistor T1.

The pixel circuit PC may not be limited to the number of thin-film transistors, the number of storage capacitors, and the circuit design described with reference to FIGS. 3 and 4, and the number of thin-film transistors, the number of storage capacitors, and the circuit design may be variously changed.

In an embodiment, some of the thin-film transistors T1, T2, T3, T4, T5, T6, and T7 may be provided as N-type metal oxide semiconductor field-effect transistors (n-type MOSFETs), and the rest may be provided as P-type metal oxide semiconductor field-effect transistors (p-type MOSFETs). As an example, among the thin-film transistors T1, T2, T3, T4, T5, T6, and T7, the driving thin-film transistor T1, the switching thin-film transistor T2, the operation control thin-film transistor T5, and the emission control thin-film transistor T6 may be provided as p-type MOSFETs, and the compensation thin-film transistor T3 and the first initialization thin-film transistor T4 and/or the second initialization thin-film transistor T7 may be provided as n-type MOSFETs. As another example, all of the thin-film transistors T1, T2, T3, T4, T5, T6, and T7 may be provided as n-type MOSFETs.

Figure 5:
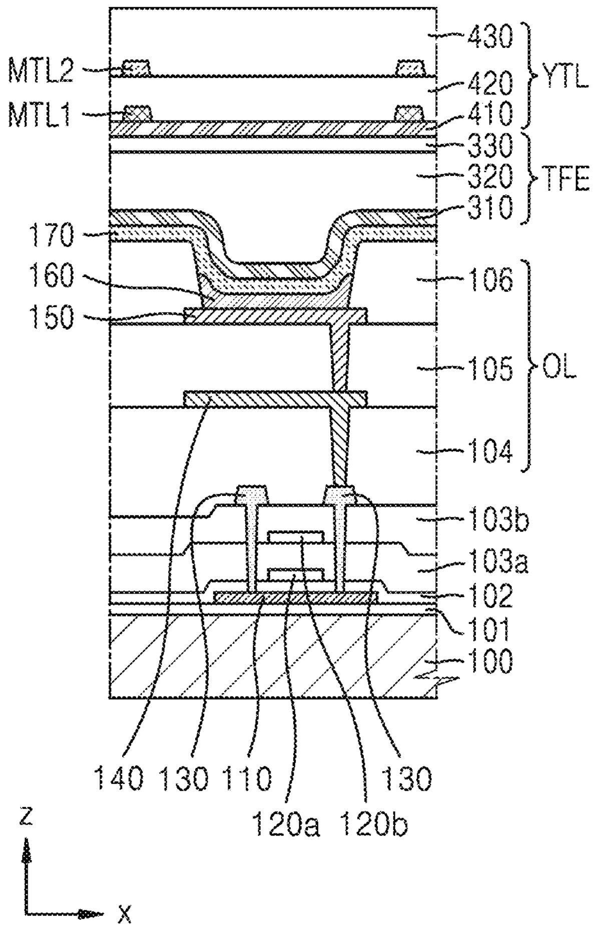
FIG. 5 is a schematic cross-sectional view of the vicinity of a pixel of the display apparatus of FIG. 1 according to an embodiment.

FIG. 5 is a schematic cross-sectional view of the vicinity of a pixel of the display apparatus of FIG. 1.

As described above, the substrate 100 may include regions corresponding to the display area DA and the peripheral area PA outside the display area DA. The substrate 100 may include various flexible or bendable materials. As an example, the substrate 100 may include glass, metal, a polymer resin, or a combination thereof. In addition, the substrate 100 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each including the polymer resin, and a barrier layer including an inorganic material (such as silicon oxide, silicon nitride, and silicon oxynitride) therebetween. However, various modifications may be made.

A buffer layer 101 may be disposed on the substrate 100. The buffer layer 101 may prevent impurity ions from diffusing, prevent penetration of moisture or external air, and serve as a barrier layer for planarizing a surface and/or a blocking layer. The buffer layer 101 may include silicon oxide, silicon nitride, silicon oxynitride, or a combination thereof. In addition, the buffer layer 101 may allow a semiconductor layer 110 to be uniformly crystallized by adjusting a heat providing speed during a crystallization process for forming the semiconductor layer 110.

The semiconductor layer 110 may be disposed on the buffer layer 101. The semiconductor layer 110 may include polycrystalline silicon and include a channel region, a source region and a drain region, wherein the channel region may not be doped with impurities, and the source region and the drain region may be on two opposite sides of the channel region and doped with impurities. Here, the impurities may change depending on the kind of a thin-film transistor. The impurities may be N-type impurities or P-type impurities.

A gate insulating layer 102 may be disposed on the semiconductor layer 110. The gate insulating layer 102 may be a configuration for securing insulation between the semiconductor layer 110 and a gate layer 120. The gate insulating layer 102 may include an inorganic material such as silicon oxide, silicon nitride, and/or silicon oxynitride, and may be arranged between the semiconductor layer 110 and the gate layer 120. The gate insulating layer 102 may have a shape corresponding to the entire surface of the substrate 100 and have a structure in which contact holes may be formed in preset portions thereof. As described above, the insulating layer including the inorganic material may be formed by chemical vapor deposition (CVD) or atomic layer deposition (ALD). This is also applicable to embodiments below and modifications thereof.

A first gate layer 120*a* may be disposed on the gate insulating layer 102. The first gate layer 120*a* may be arranged at a position overlapping the semiconductor layer 110 vertically and may include at least one metal among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and titanium (Ti), tungsten (W), and copper (Cu).

A first interlayer insulating layer 103*a* may be disposed on the first gate layer 120*a*. The first interlayer insulating layer 103*a* may cover the first gate layer 120*a*. The first interlayer insulating layer 103*a* may include an inorganic material. As an example, the first interlayer insulating layer 103*a* may include metal oxide or metal nitride, and specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In an embodiment, the first interlayer insulating layer 103*a* may have a dual structure of $SiO_x/SiN_y$ or $SiN_x/SiO_y$.

A second gate layer 120*b* may be disposed on the first interlayer insulating layer 103*a*. The second gate layer 120*b* may be arranged at a position overlapping the first gate layer 120*a* vertically and may include at least one metal among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and titanium (Ti), tungsten (W), and copper (Cu).

The second gate layer 120*b* may constitute the storage capacitor Cst in cooperation with the first gate layer 120*a*. The first gate layer 120*a* may be one of electrodes of the storage capacitor Cst, and the second gate layer 120*b* may be another electrode of the storage capacitor Cst.

In case that viewed in a direction perpendicular to the substrate 100, the area of the second gate layer 120*b* may be greater than the area of the first gate layer 120*a*. As another example, in case that viewed in a direction perpendicular to the substrate 100, the second gate layer 120*b* may cover the first gate layer 120*a*.

A second interlayer insulating layer 103*b* may be disposed on the second gate layer 120*b*. The second interlayer insulating layer 103*b* may cover the second gate layer 120*b*. The second interlayer insulating layer 103*b* may include an inorganic material. As an example, the second interlayer insulating layer 103*b* may include metal oxide or metal nitride, and specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof. In an embodiment, the second interlayer insulating layer 103*b* may have a dual structure of $SiO_x/SiN_y$ or $SiN_x/SiO_y$.

A first conductive layer 130 may be disposed on the second interlayer insulating layer 103*b*. The first conductive layer 130 may serve as an electrode electrically connected to source/drain regions of the semiconductor layer through contact holes included in the second interlayer insulating layer 103*b*. The first conductive layer 130 may include at least one metal among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). As an example, the first conductive layer 130 may include a Ti layer, an Al layer, and/or a Cu layer.

A first organic insulating layer 104 may be disposed on the first conductive layer 130. The first organic insulating layer 104 may cover the first conductive layer 130, have an approximately flat upper surface, and may be an organic insulating layer serving as a planarization layer. The first organic insulating layer 104 may include, for example, acryl, benzocyclobutene (BCB), or hexamethyldisiloxane (HMDSO). The first organic insulating layer 104 may include a single layer or a multi-layer. However, various modifications may be made.

A second conductive layer 140 may be disposed on the first organic insulating layer 104. The second conductive layer 140 may serve as an electrode electrically connected to source/drain regions of the semiconductor layer through contact holes included in the first organic insulating layer 104. The second conductive layer 140 may include at least one metal among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). As an example, the second conductive layer 140 may include a Ti layer, an Al layer, and/or a Cu layer.

A second organic insulating layer 105 may be disposed on the first conductive layer 130. The second organic insulating layer 105 may cover the first conductive layer 130, have an approximately flat upper surface, and may be an organic insulating layer serving as a planarization layer. The second organic insulating layer 105 may include, for example, acryl, benzocyclobutene (BCB), or hexamethyldisiloxane (HMDSO). The second organic insulating layer 105 may include a single layer or a multi-layer. However, various modifications may be made.

An organic insulating layer OL may include the first organic insulating layer 104 and the second organic insulating layer 105. In addition, the organic insulating layer OL may further include an additional insulating layer described below.

Although not shown in FIG. 5, the additional conductive layer and the additional insulating layer may be arranged between the conductive layer and the pixel electrode, and applicable to various embodiments. The additional conductive layer may include the same material as the conductive layer and have the same layered structure as the conductive layer. The additional insulating layer may include the same material as the organic insulating layer and have the same layered structure as the organic insulating layer.

A pixel electrode 150 may be disposed on the second organic insulating layer 105. The pixel electrode 150 may be electrically connected to the second conductive layer 140 through a contact hole formed in the second organic insulating layer 105. The display element may be disposed on the pixel electrode 150. An organic light-emitting diode OLED may be used as the display element. For example, the organic light-emitting diode OLED may be disposed on the pixel electrode 150. The pixel electrode 150 may include a light-transmissive conductive layer and a reflective layer, wherein the light-transmissive conductive layer may include a light-transmissive conductive oxide such as indium tin oxide (ITO), indium oxide ($In_2O_3$), indium zinc oxide (IZO), or a combination thereof, and the reflective layer includes metal such as aluminum (Al) or silver (Ag). As an example, the pixel electrode 150 may have a three-layered structure of ITO/Ag/ITO.

A pixel-defining layer 106 may be disposed on the second organic insulating layer 105 and arranged to cover the edges of the pixel electrode 150. For example, the pixel-defining layer 106 may cover the edges of the pixel electrode 150. The pixel-defining layer 106 has a pixel-opening and the pixel-opening may be formed to expose at least the central portion of the pixel electrode 150. The pixel-defining layer 106 may include an organic material such as polyimide or HMDSO. In addition, a spacer (not shown) may be disposed on the pixel-defining layer 106.

An intermediate layer 160 and an opposite electrode 170 may be arranged in the pixel-opening of the pixel-defining layer 106. The intermediate layer 160 may include a low-molecular weight material or a polymer material. In the case where the intermediate layer 160 includes a low-molecular weight material, the intermediate layer 160 may include a hole injection layer, a hole transport layer, an electron transport layer, and/or an electron injection layer. In the case where the intermediate layer 160 include a polymer material, the intermediate layer 160 may generally have a structure including the hole transport layer and the emission layer.

The opposite electrode 170 may include a light-transmissive conductive layer including a light-transmissive conductive oxide such as ITO, $In_2O_3$, IZO, or a combination thereof. The pixel electrode 150 may be used as an anode, and the opposite electrode 170 may be used as a cathode. The polarity of the electrode may be reversely applied.

The structure of the intermediate layer 160 may not be limited thereto and may have various structures. As an example, at least one of layers constituting the intermediate layer 160 may be integral with each other like the opposite electrode 170. In an embodiment, the intermediate layer 160 may include a layer patterned to correspond to each of multiple pixel electrodes 150.

The opposite electrode 170 may be arranged in the upper portion of the display area DA and arranged over the entire surface of the display area DA. For example, the opposite electrode 170 may be integral with each other to cover the pixels. The opposite electrode 170 may be in electrical contact with a common power supply line (not shown) arranged in the peripheral area PA. As an example, the opposite electrode 170 may extend to a partition wall (or bank) 200.

A thin-film encapsulation layer TFE may cover the display area DA entirely, and extend to the peripheral area PA to cover at least a portion of the peripheral area PA. The thin-film encapsulation layer TFE may extend to the outside of the common power supply line (not shown). The thin-film encapsulation layer TFE may include a first inorganic encapsulation layer 310, a second inorganic encapsulation layer 330, and an organic encapsulation layer 320 therebetween. The first and second inorganic encapsulation layer 310 and 330 may include at least one inorganic material among aluminum oxide, titanium oxide, tantalum oxide, hafnium oxide, zinc oxide, silicon oxide, silicon nitride, silicon oxynitride, and the like.

The first and second inorganic encapsulation layer 310 and 330 may include a single layer or a multi-layer including the above materials. The first inorganic encapsulation layer 310 and the second inorganic encapsulation layer 330 may include a same material or different materials. The thickness of the first inorganic encapsulation layer 310 may be different from that of the second inorganic encapsulation layer 330. The thickness of the first inorganic encapsulation layer 310 may be greater than that of the second inorganic encapsulation layer 330. As another example, the thickness of the second inorganic encapsulation layer 330 may be greater than that of the first inorganic encapsulation layer 310, or the thickness of the first inorganic encapsulation layer 310 may be the same as that of the second inorganic encapsulation layer 330.

The organic encapsulation layer 320 may include a monomer-based material and/or a polymer-based material. The polymer-based material may include an acryl-based resin, an epoxy-based resin, polyimide, and polyethylene. In an embodiment, the organic encapsulation layer 320 may include acrylate.

A touch electrode layer YTL may be disposed on the thin-film encapsulation layer TFE or the second inorganic encapsulation layer 330. The touch electrode layer YTL may have a multi-layered structure. The touch electrode layer YTL may include a sensing electrode, a trace line connected to the sensing electrode, and at least one insulating layer. The touch electrode layer YTL may be configured to sense an external input by using, for example, a capacitive method. As described above, an operation method of the touch electrode layer YTL may not be particularly limited. In an embodiment, the touch electrode layer YTL may be configured to sense an external input using an electromagnetic induction method or a pressure sensing method.

The touch electrode layer YTL may include a first touch insulating layer 410, a first touch conductive layer MTL1, a second touch insulating layer 420, a second touch conductive layer MTL2, and a third touch insulating layer 430.

The first touch insulating layer 410 may be disposed on the thin-film encapsulation layer TFE. The first touch insulating layer 410 may include an inorganic material or an organic material, and include a single layer or a multi-layer. The organic material may include at least one of an acryl-based resin, a methacryl-based resin, a polyisoprene, a vinyl-based resin, an epoxy-based resin, a urethane-based resin, a cellulose-based resin, and a perylene-based resin. The inorganic material may include at least one of silicon nitride ($SiN_X$), aluminum nitride (AlN), zirconium nitride (ZrN), titanium nitride (TiN), hafnium nitride (HfN), tantalum nitride (TaN), silicon oxide ($SiO_X$), aluminum oxide ($Al_2O_3$), titanium oxide ($TiO_2$), tin oxide ($SnO_2$), cerium oxide ($CeO_2$), and silicon oxynitride (SiON).

The first touch insulating layer 410 may prevent damage to the thin-film encapsulation layer TFE and block interference signals that may occur while the touch electrode layer YTL is driven.

As an example, the first touch conductive layer MTL1 and the second touch conductive layer MTL2 may each have a single-layered structure or a stacked multi-layered structure. A conductive layer of a single-layered structure may include a metal layer or a transparent conductive layer. The metal layer may include at least one of molybdenum (Mo), silver (Ag), titanium (Ti), copper (Cu), aluminum (Al), and an alloy thereof. The transparent conductive layer may include a transparent conductive oxide such as indium tin oxide (ITO), indium zinc oxide (IZO), zinc oxide (ZnO), indium tin zinc oxide (ITZO), or a combination thereof. In addition, the transparent conductive layer may include a conductive polymer such as poly-3,4-ethylene dioxy thiophene (PEDOT), metal nanowires, graphene, the like, or a combination thereof.

The conductive layer of the multi-layered structure may include multi-layered metal layers. The multi-layered metal layers may have, for example, a three-layered structure. The multi-layered metal layers may include at least one metal layer and at least one transparent conductive layer.

Each of the first touch conductive layer MTL1 and the second touch conductive layer MTL2 may include multiple patterns. The first touch conductive layer MTL1 may include first conductive patterns, and the second touch conductive layer MTL2 may include second conductive patterns. The first conductive patterns and the second conductive patterns may constitute the sensing electrode.

The first touch conductive layer MTL1 may be electrically connected to the second touch conductive layer MTL2 through a contact hole. As an example, the first touch conductive layer MTL1 and the second touch conductive layer MTL2 may have a mesh structure such that light emitted from a light-emitting material below passes therethrough. The first touch conductive layer MTL1 and the second touch conductive layer MTL2 may be arranged not to overlap patterns in which the light-emitting material may be printed in a plan view.

The second touch insulating layer 420 may include an organic material. The organic material may include at least one of an acryl-based resin, a methacryl-based resin, a polyisoprene, a vinyl-based resin, an epoxy-based resin, a urethane-based resin, a cellulose-based resin, and a perylene-based resin. The second touch insulating layer 420 may further include an inorganic material. The inorganic material may include at least one of silicon nitride ($SiN_X$), aluminum nitride (AlN), zirconium nitride (ZrN), titanium nitride (TiN), hafnium nitride (HfN), tantalum nitride (TaN), silicon oxide ($SiO_X$), and aluminum oxide ($Al_2O_3$), titanium oxide ($TiO_2$), tin oxide ($SnO_2$), cerium oxide ($CeO_2$), and silicon oxynitride (SiON).

The third touch insulating layer 430 may be disposed on the second touch conductive layer MTL2. The third touch insulating layer 430 may have a single-layered structure or a multi-layered structure. The third touch insulating layer 430 may include an organic material, an inorganic material, or a composite material. The inorganic material may include at least one of silicon nitride ($SiN_X$), aluminum nitride (AlN), zirconium nitride (ZrN), titanium nitride (TiN), hafnium nitride (HfN), tantalum nitride (TaN), silicon oxide ($SiO_X$), and aluminum oxide ($Al_2O_3$), titanium oxide ($TiO_2$), tin oxide ($SnO_2$), cerium oxide ($CeO_2$), and silicon oxynitride (SiON). The organic material may include at least one of an acryl-based resin, a methacryl-based resin, a polyisoprene, a vinyl-based resin, an epoxy-based resin, a urethane-based resin, a cellulose-based resin, and a perylene-based resin.

A color filter layer and the like may be further disposed on the touch electrode layer YTL, wherein the color filter layer may be configured to improve a light-extraction efficiency of the display element OLED.

Figure 6:
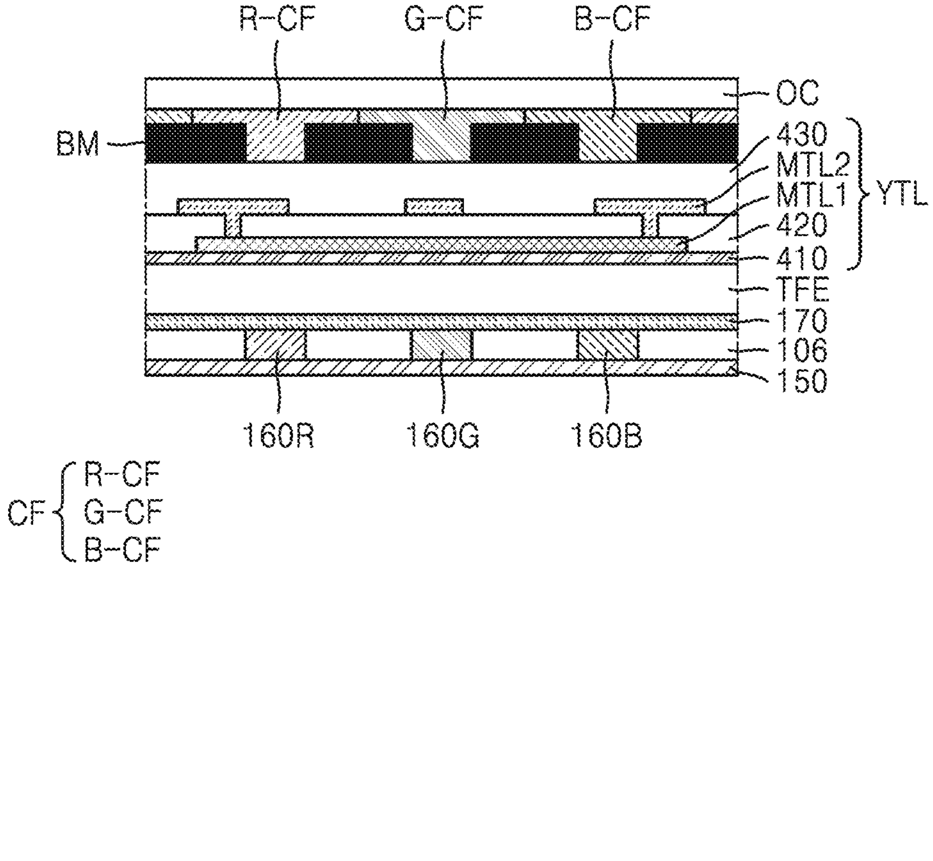
FIG. 6 is a schematic cross-sectional view of an example of the display apparatus of FIG. 1, taken along line I-II of FIG. 1 according to an embodiment.

FIG. 6 is a schematic cross-sectional view of the vicinity of the touch electrode layer of the display apparatus of FIG. 1. For reference, in the description of FIG. 6, contents identical to or repeating those described above may be omitted.

A light-blocking material layer BM may be disposed on the touch electrode layer YTL. The light-blocking material layer BM may be a black matrix and may include various materials that may absorb at least a portion of light. As an example, the light-blocking material layer BM may include at least one of carbon black, graphite, a chromium-based material, a dye, a metal reflective film, and a light absorbing film. The light-blocking material layer BM may be configured to not only block or prevent external light reflection but also prevent internal reflection of light occurring in the display element.

The light-blocking material layer BM may further include a water-soluble salt. The water-soluble salt may include at least one of sodium, potassium, magnesium, manganese, aluminum, and calcium. The water-soluble salt included in the light-blocking material layer BM may be a material that corrodes a metallic material inside the display apparatus together with moisture penetrating from the outside.

A color filter layer CF may be disposed on the touch electrode layer YTL or the third touch insulating layer 430. The color filter layer CF may be configured to selectively transmit light in a specific wavelength band. A specific wavelength band that passes through the color filter layer CF may correspond to a wavelength band of light emitted from the display element OLED or colored intermediate layers 160R, 160G and 160B disposed below the relevant color filter layer CF.

Specifically, the color filter layer CF may include a first color filter R-CF, a second color filter G-CF, and a third color filter B-CF, wherein the first color filter R-CF may be configured to pass light in a first wavelength band (e.g., red-based visible light), the second color filter G-CF may be configured to pass light in a second wavelength band (e.g., green-based visible light) different from the first wavelength band, and the third color filter B-CF may be configured to pass light in a third wavelength band (e.g., blue-based visible light) different from the first wavelength band and the second wavelength band. As an example, each of the first to third wavelength bands may be a wavelength corresponding to one of three primary colors of light known as RGB.

In case that viewed in a direction perpendicular to the substrate 100, the edge of the first color filter R-CF may overlap the light-blocking material layer BM. In addition, in case that viewed in a direction perpendicular to the substrate 100, one side of the edges of the second color filter G-CF may be adjacent to one side of the edges of the first color filter R-CF. Likewise, in case that viewed in a direction perpendicular to the substrate 100, one side of the edges of the third color filter B-CF may be adjacent to another side of the edges of the first color filter R-CF.

In other words, in case that viewed in a direction perpendicular to the substrate 100, the second color filter G-CF may be adjacent to one side of the first color filter R-CF, and the third color filter B-CF may be adjacent to another side of the first color filter R-CF.

In case that viewed in a direction perpendicular to the substrate 100, the edge of the second color filter G-CF and the edge of the third color filter B-CF may also overlap the light-blocking material layer BM. In other words, the edge of the color filter layer CF may cover the upper surface or a portion of the upper surface of a light-blocking material layer BM.

Figure 7:
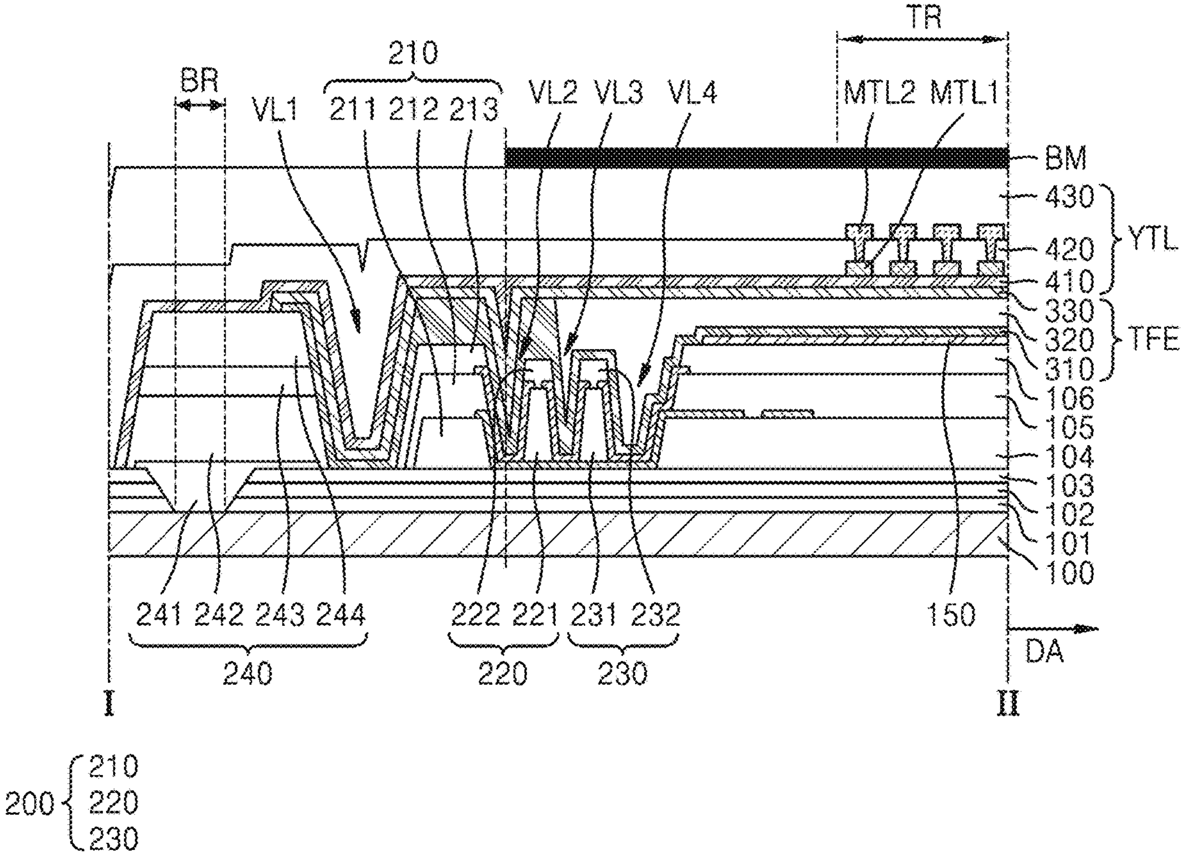
FIG. 7 is a schematic cross-sectional view of an example of the display apparatus of FIG. 1, taken along line I-II of FIG. 1 according to an embodiment.

FIG. 7 is a schematic cross-sectional view of an example of the display apparatus of FIG. 1, taken along line I-II of FIG. 1. For reference, in the description of FIG. 7, contents identical to or repeating those described above may be omitted.

As shown in FIG. 7, the display apparatus according to an embodiment may include the substrate 100, at least one inorganic material layer, at least one organic material layer, the touch electrode layer YTL, at least one bank 200, and the light-blocking material layer BM. For convenience of description, illustration of the color filter layer CF of FIG. 6 may be omitted in FIG. 7.

The description of the substrate 100 may be the same as described above, and the substrate 100 may include the display area DA and the peripheral area PA. The peripheral area PA may include the bending area BR that may be bent about the bending axis. The bending axis may denote a virtual axis for defining the bending area BR.

The at least one inorganic material layer may be disposed on the substrate 100. The at least one inorganic material layer may include one inorganic material layer or multiple inorganic material layers. As an example, the at least one inorganic material layer includes multiple inorganic material layers and may include the buffer layer 101, the gate insulating layer 103, the interlayer insulating layers 103*a* and 103*b*, and the like.

The at least one organic material layer may be disposed on the at least one inorganic material layer. The at least one organic material layer may include one organic material layer or multiple organic material layers. As an example, the at least one organic material layer includes multiple organic material layers and may include the first organic insulating layer 104, the second organic insulating layer 105 and the like.

The touch electrode layer YTL may be disposed on the at least one organic material layer. As described above, the touch electrode layer YTL may include the first touch insulating layer 410, the first touch conductive layer MTL1, the second touch insulating layer 420, the second touch conductive layer MTL2, the third touch insulating layer 430 and the like, and the first touch conductive layer MTL1 and the second touch conductive layer MTL2 may be electrically connected to each other through a through hole formed in the second touch insulating layer 420. The touch electrode layer YTL may include multiple touch electrodes. The touch electrodes may include the first touch conductive layer MTL1 and the second touch conductive layer MTL2 electrically connected to each other through a through hole.

As shown in FIG. 7, in a plan view, a region in which the touch electrodes may be arranged may be a trace region TR. The trace region TR may be arranged over the display area DA and the peripheral area PA. As another example, the trace region TR may be arranged in a portion of the peripheral area PA. As another example, the trace region TR may be arranged in a region of the peripheral area PA adjacent to the display area DA. As another example, the touch electrodes or the trace region TR illustrated in FIG. 7 and the like may be arranged outside the display area DA and arranged between the bending area BR and the display area DA.

As an example, the touch electrodes arranged in the trace region TR may be touch lines and may be configured to transfer electrical signals received from other touch electrodes arranged in the display area DA to a related circuit.

The at least one bank 200 may be disposed on the at least one inorganic material layer. The at least one bank 200 may be arranged between the bending area BR and the display area DA in a plan view. The at least one bank 200 may include an organic material and have a single-layered structure or a multi-layered structure. As an example, the at least one bank 200 may include multiple banks. The banks may include a first bank 210, a second bank 220 and the like. In the numbering of the banks, a bank arranged closest to the bending area BR in a plan view may be defined as the first bank 210, and the size of the number given to the bank may increase as the bank is arranged closer to the display area DA.

The light-blocking material layer BM may be disposed on the touch electrode layer YTL. The edge of the light-blocking material layer BM may be arranged in the peripheral area PA on the touch electrode layer YTL. One end of the light-blocking material layer BM may be arranged between the bending area BR and the display area DA in a plan view. As an example, an end of the light-blocking material layer BM may be a portion of the edge (or peripheral edge) of the light-blocking material layer BM and may denote a portion of the edge of the light-blocking material layer BM arranged between the bending area BR and the display area DA.

As shown in FIG. 7, an end of the light-blocking material layer BM may be arranged between the bending area BR and the trace region TR in a plan view. In a plan view, an end of the light-blocking material layer BM may be arranged between at least one bank 200 and the touch electrodes.

In case that an end of the light-blocking material layer BM may be arranged between at least one bank 200 and the touch electrodes in a plan view, it may denote that an end of the light-blocking material layer BM may be arranged between the at least one bank 200 and a touch electrode of the touch electrodes arranged closest to the bending area BR.

The first bank 210 may be disposed on the at least one inorganic material layer. The first bank 210 may be arranged between the bending area BR and the touch electrodes in a plan view. The first bank 210 may be arranged between the bending area BR and the trace region TR in a plan view.

The first bank 210 may include multiple sub-banks. As an example, the first bank 210 may include a (1-1)st sub-bank 211 disposed on the at least one inorganic material layer. The (1-1)st sub-bank 211 and the first organic insulating layer 104 may include a same material. The first bank 210 may further include a (1-2)nd sub-bank 212 disposed on the (1-1)st sub-bank 211. The (1-2)nd sub-bank 212 and the second organic insulating layer 105 may include a same material. The first bank 210 may further include a (1-3)rd sub-bank 213 disposed on the (1-2)nd sub-bank 212. The (1-3)rd sub-bank 213 and the pixel-defining layer 106 may include a same material.

The second bank 220 may be disposed on the at least one inorganic material layer. The second bank 220 may be arranged between the first bank 210 and the touch electrodes in a plan view. The second bank 220 may be apart from the first bank 210 in a plan view. The second bank 220 may be arranged between the first bank 210 and the trace region TR in a plan view.

The second bank 220 may include multiple sub-banks. As an example, the second bank 220 may include a (2-1)st sub-bank 221 disposed on the at least one inorganic material layer. The (2-1)st sub-bank 221 and the second organic insulating material 105 may include a same material. The second bank 220 may further include a (2-2)nd sub-bank 222 disposed on the (2-1)st sub-bank 221. The (2-2)nd sub-bank 222 and the pixel-defining layer 106 may include a same material. Depending on the case, the second bank 220 may further include an additional sub-bank disposed between the at least one inorganic material layer and the (2-1)st sub-bank 221. The additional bank and the first organic insulating layer 104 may include a same material.

The third bank 230 may be disposed on the at least one inorganic material layer. The third bank 230 may be arranged between the second bank 220 and the touch electrodes in a plan view. The third bank 230 may be apart from the second bank 220 in a plan view. The third bank 230 may be arranged between the second bank 220 and the trace region TR in a plan view.

The third bank 230 may include multiple sub-banks. As an example, the third bank 230 may include a (3-1)st sub-bank 231 disposed on the at least one inorganic material layer. The (3-1)st sub-bank 231 and the second organic insulating layer 105 may include a same material. The third bank 230 may further include a (3-2)nd sub-bank 232 disposed on the (3-1)st sub-bank 231. The (3-2)nd sub-bank 232 and the pixel-defining layer 106 may include a same material. Depending on the case, the third bank 230 may further include an additional sub-bank disposed between the at least one inorganic material layer and the (3-1)st sub-bank 231. The additional bank and the first organic insulating layer 104 may include a same material.

As shown in FIG. 7, an end of the light-blocking material layer BM may be arranged between the first bank 210 and the second bank 220 in a plan view. An end of the light-blocking material layer BM may overlap a region dented toward the substrate 100 (i.e., a valley structure) between the first bank 210 and the second bank 220 in a plan view.

As shown in FIG. 7, the display apparatus according to an embodiment may further include an outer bank 240 arranged in the bending area BR in a plan view and having a portion that fills an opening formed in the bending area BR. The opening formed in the bending area BR exposes the upper surface of the substrate 100 upward. The upper surface of the substrate 100 exposed through the opening formed in the bending area BR may contact the portion of outer bank 240 that fills the opening formed in the bending area BR. The outer bank 240 may include an organic material. The outer bank 240 may be arranged further away from the display area DA than the first bank 210 in a plan view.

The outer bank 240 or a portion of the outer bank 240 may be disposed on a portion of the upper surface of the substrate 100 exposed by the opening. Another portion of the outer bank 240 may be disposed on the at least one inorganic material layer or may cover an inner wall of the at least one inorganic material layer. The outer bank 240 may be formed over a portion of a sub-area AE2, the bending area BR, and a portion of the main area AE1 in a plan view. The outer bank 240 may be apart from the first bank 210 in a plan view. At least a portion of the outer bank 240 may fill an opening formed in the bending area BR of the at least one inorganic material layer. In the case where the at least one inorganic material layer includes multiple inorganic material layers, at least a portion of the outer bank 240 may fill the opening formed in the bending area BR of the inorganic material layers with an organic material.

The outer bank 240 may include multiple sub-banks. As an example, the outer bank 240 may include a first sub-outer bank 241 disposed on a portion of the upper surface of the substrate 100 exposed by the opening. Depending on the case, a portion of the first sub-outer bank 241 may cover an inner surface of the at least one inorganic material layer. Depending on the case, the edge of the first sub-outer bank 241 may be disposed on the at least one inorganic material layer. The first sub-outer bank 241 and the first organic insulating layer 104 may include a same material.

As an example, the outer bank 240 may further include a second sub-outer bank 242 disposed on the first sub-outer bank 241. The second sub-outer bank 242 and the second organic insulating layer 105 may include a same material. Depending on the case, the outer bank 240 may further include a third sub-outer bank 243 disposed on the second sub-outer bank 242. The third sub-outer bank 243 and the pixel-defining layer 106 may include a same material. Depending on the case, the outer bank 240 may further include a fourth sub-outer bank 244 disposed on the third sub-outer bank 243. The fourth sub-outer bank 244 and a spacer (not shown) disposed on the pixel-defining layer 106 may include a same material.

As shown in FIG. 7, the display apparatus according to an embodiment may include at least one valley structure. The valley structure may denote a structure including an organic material filling a region dented to have a valley shape. The valley structure may be formed to protect inner elements of the display apparatus from impact applied from the outside. The valley structure may include through holes formed in the insulating layers and openings formed in an insulating layer arranged in the lowermost portion, and include an organic material filling the through holes and the opening in a direction perpendicular to the substrate 100. The organic material that fills the openings and the through holes in an insulating layer may have a pillar shape.

The first valley structure VL1 may be formed between the outer bank 240 and the first bank 210. A lateral surface of the outer bank 240 and a lateral surface of the first bank 210 may be arranged to face each other. A distance between a lateral surface of the outer bank 240 and a lateral surface of the first bank 210 may be reduced (i.e., tapered) toward a direction facing the substrate 100, and the distance between the two lateral surfaces may increase toward the opposite direction. As a result, a lateral surface of the outer bank 240 and a lateral surface of the first bank 210 may define a V-shaped valley structure.

A second valley structure VL2 may be formed between the first bank 210 and the second bank 220. Another lateral surface of the first bank 210 and a lateral surface of the second bank 220 may be arranged to face each other. A distance between another lateral surface of the first bank 210 and a lateral surface of the second bank 220 may be reduced (i.e., tapered) toward a direction facing the substrate 100, and the distance between the two lateral surfaces may increase toward the opposite direction. As a result, another lateral surface of the first bank 210 and a lateral surface of the second bank 220 may define a V-shaped valley structure.

A third valley structure VL3 may be formed between the second bank 220 and the third bank 230. Another lateral surface of the second bank 220 and a lateral surface of the third bank 230 may be arranged to face each other. A distance between another lateral surface of the second bank 220 and a lateral surface of the third bank 230 may be reduced (i.e., tapered) toward a direction facing the substrate 100, and the distance between the two lateral surfaces may increase toward the opposite direction. As a result, another lateral surface of the second bank 220 and a lateral surface of the third bank 230 may define a V-shaped valley structure.

A fourth valley structure VL4 may be formed between the third bank 230 and an edge of the organic insulating layer OL. Another lateral surface of the third bank 230 and a side edge of the organic insulating layer OL may be arranged to face each other. A distance between another lateral surface of the third bank 230 and a side edge of the organic insulating layer OL may be reduced (i.e., tapered) toward a direction facing the substrate 100, and the distance between the two surfaces may increase toward the opposite direction. As a result, another lateral surface of the third bank 230 and a side edge of the organic insulating layer OL may define a V-shaped valley structure.

Although FIG. 7 shows the first to third banks 210, 220, and 230 and the first to fourth valley structures VL1, VL2, VL3, and VL4, these may be only examples. In case needed, the second bank 220 and/or the third bank 230 may be omitted, and the third valley structure VL3 and/or the fourth valley structure VL4 may be omitted from the display apparatus according to an embodiment.

As shown in FIG. 7, an end of the light-blocking material layer BM may overlap the second valley structure VL2 in a plan view. As an example, an end of the light-blocking material layer BM may overlap another lateral surface of the first bank 210 or a lateral surface of the second bank 220 in the second valley structure VL2 in a plan view. As another example, an end of the light-blocking material layer BM may overlap another lateral surface of the first bank 210 or a bottom surface connecting a lateral surface of the second bank 220 in the second valley structure VL2 in a plan view. the light-blocking material layer BM may cover multiple touch electrodes in a plan view. The touch electrodes overlapping the light-blocking material layer BM may include touch electrodes arranged in the trace region TR. As another example, the light-blocking material layer BM may overlap the touch electrodes in a plan view. As a result of the overlapping, the touch electrodes may be hidden by the light-blocking material layer BM in a plan view. Because the touch electrodes arranged in the trace region TR may reflect external light, in case that the touch electrodes are not hidden by the light-blocking material layer BM, the touch electrodes may adversely influence the image quality of the display apparatus.

For reference, the touch electrodes arranged in regions other than the trace region TR may be blocked from external light by a polarizing layer (not shown) or a color filter layer replacing the polarizing layer, or be covered by a region of the light-blocking material layer BM arranged in the region other than the trace region TR.

Figure 8:
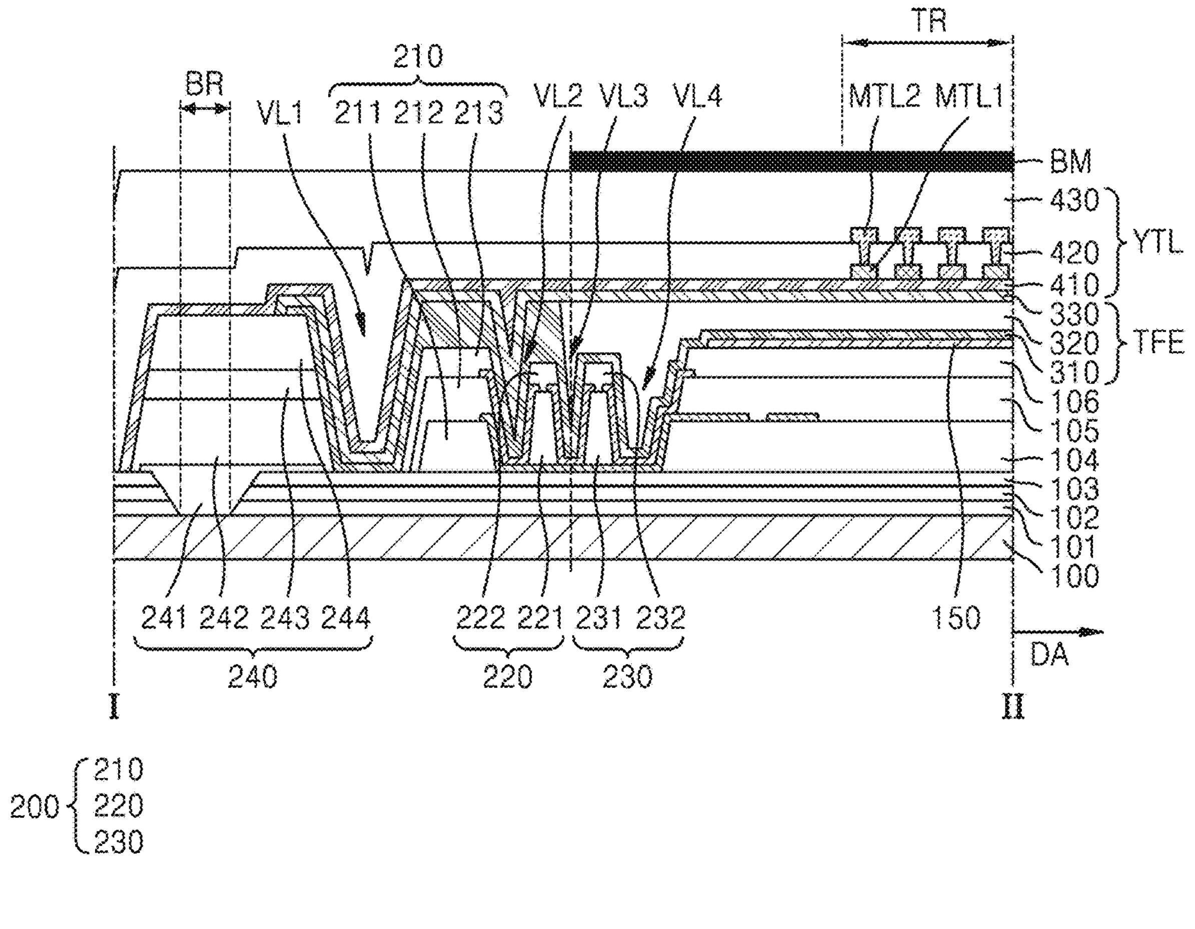
FIG. 8 is a schematic cross-sectional view of an example of the display apparatus of FIG. 1, taken along line I-II of FIG. 1 according to an embodiment.

FIG. 8 is a schematic cross-sectional view of an example of the display apparatus of FIG. 1, taken along line I-II of FIG. 1. For reference, in the description of FIG. 8, contents identical to or repeating those described above may be omitted.

As shown in FIG. 8, an end of the light-blocking material layer BM may be arranged between the second bank 220 and the third bank 230 in a plan view. An end of the light-blocking material layer BM may overlap a region dented toward the substrate 100 in a plan view between the second bank 220 and the third bank 230.

As shown in FIG. 8, an end of the light-blocking material layer BM may overlap the third valley structure VL3 in a plan view. As an example, an end of the light-blocking material layer BM in a plan view may overlap another lateral surface of the second bank 220 or a lateral surface of the third bank 230 in the third valley structure VL3. As another example, an end of the light-blocking material layer BM in a plan view may overlap another lateral surface of the second bank 220 or a bottom surface connecting one lateral surface of the third bank 230 in the third valley structure VL3.

Figure 9:
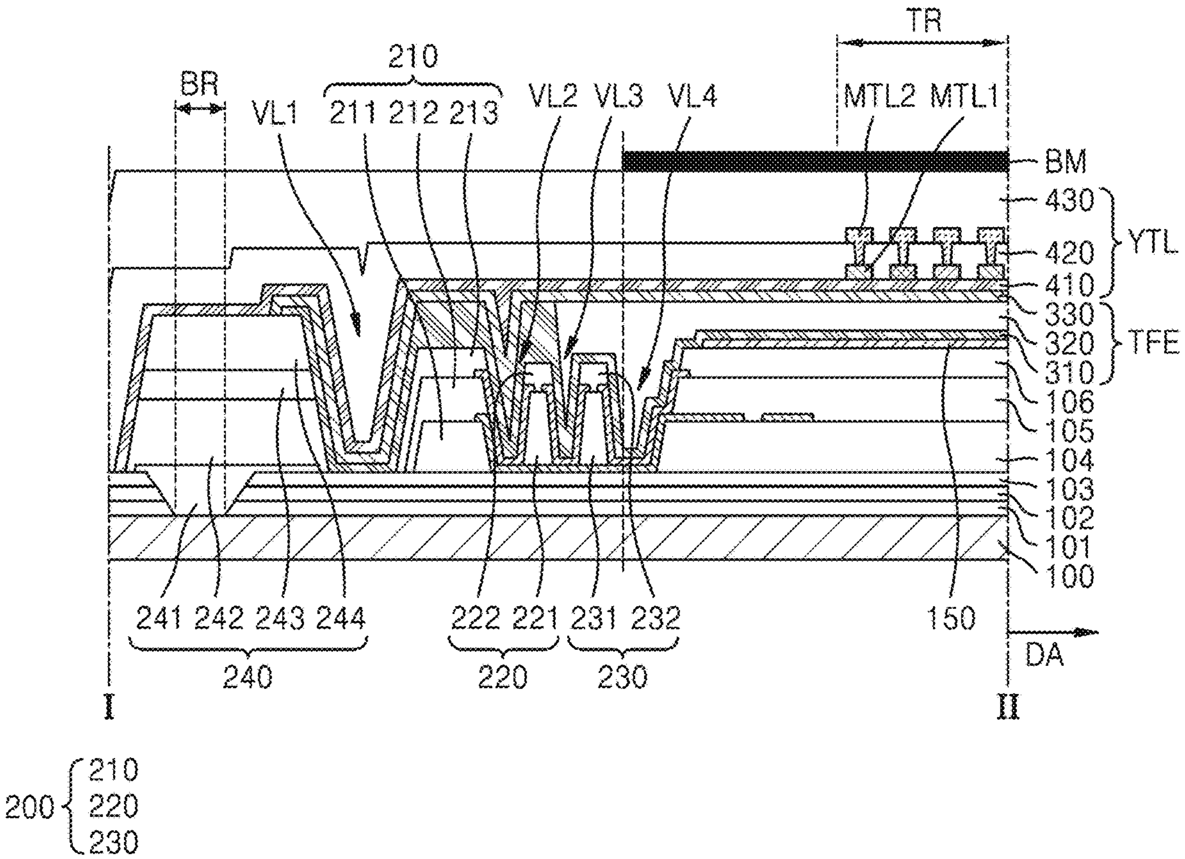
FIG. 9 is a schematic cross-sectional view of an example of the display apparatus of FIG. 1, taken along line I-II of FIG. 1 according to an embodiment.

FIG. 9 is a schematic cross-sectional view of an example of the display apparatus of FIG. 1, taken along line I-II of FIG. 1. For reference, in the description of FIG. 9, contents identical to or repeating those described above may be omitted.

As shown in FIG. 9, an end of the light-blocking material layer BM in a plan view may be arranged between the third bank 230 and the organic insulating layer OL. an end of the light-blocking material layer BM in a plan view may overlap a region dented toward the substrate 100 between the third bank 230 and a cross-section of the organic insulating layer OL. The organic insulating layer OL may include the first organic insulating layer 104 and the second organic insulating layer 105. As another example, the organic insulating layer OL may include the first organic insulating layer 104, the second organic insulating layer 105, and the pixel-defining layer 106.

An edge (or side edge or cross-section) of the organic insulating layer OL mentioned in the specification may denote an edge arranged between the bending area BR and the display area DA among the edges of the organic insulating layer OL disposed on the substrate 100. As another example, an edge of the organic insulating layer OL mentioned in the specification may denote an edge arranged between the bending area BR and the trace region TR among the side edges of the organic insulating layer OL disposed on the substrate 100.

As shown in FIG. 9, an end of the light-blocking material layer BM may overlap in a plan view the fourth valley structure VL4. As an example, an end of the light-blocking material layer BM may overlap in a plan view another lateral surface of the third bank 230 or an edge of the organic insulating layer OL in the fourth valley structure VL4. As another example, an end of the light-blocking material layer BM may overlap in a plan view another lateral surface of the third bank 230 or a bottom surface connecting an edge of the organic insulating layer OL in the fourth valley structure VL4.

Figure 10:
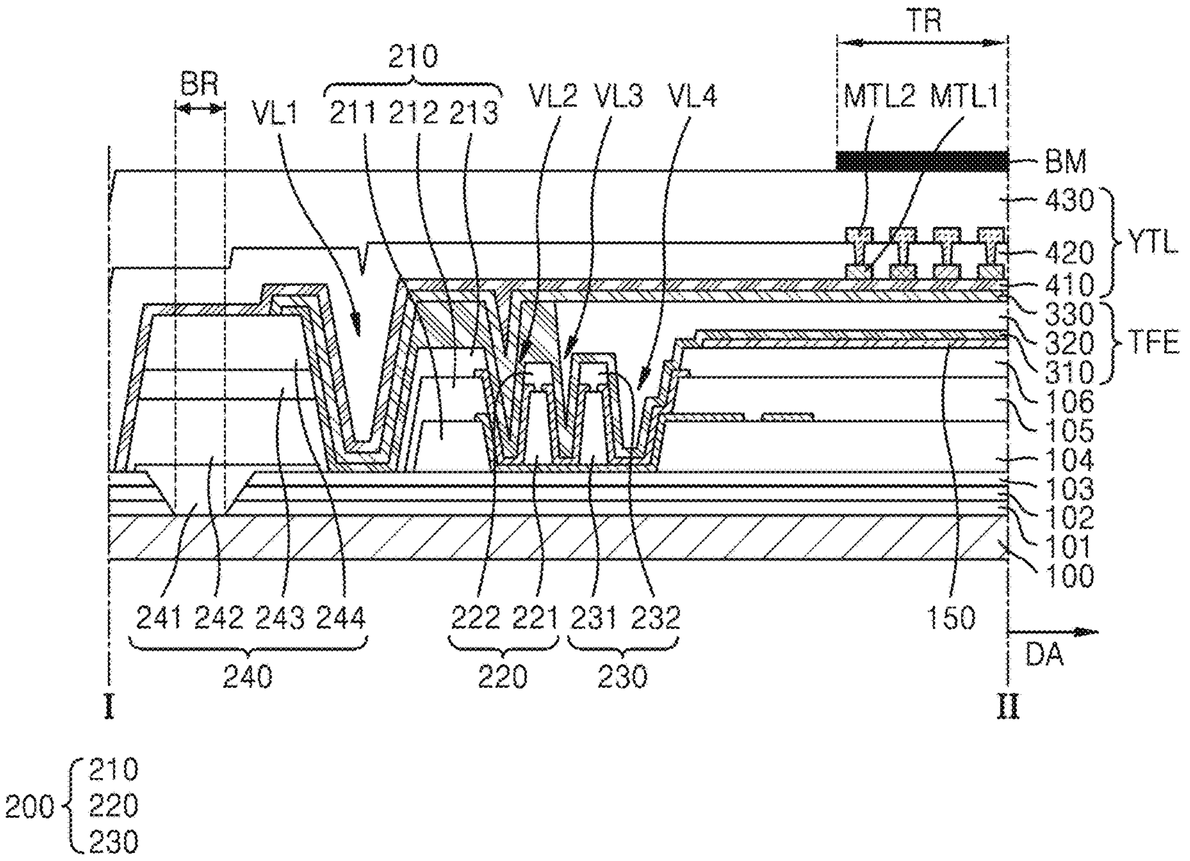
FIG. 10 is a schematic cross-sectional view of an example of the display apparatus of FIG. 1, taken along line I-II of FIG. 1 according to an embodiment.

FIG. 10 is a schematic cross-sectional view of an example of the display apparatus of FIG. 1, taken along line I-II of FIG. 1. For reference, in the description of FIG. 10, contents identical to or repeating those described above may be omitted.

As shown in FIG. 10, an end of the light-blocking material layer BM in a plan view may be arranged between an edge of the organic insulating layer OL and the outermost edge of the trace region TR. The outermost edge of the trace region TR may denote the boundary of the trace region TR in a plan view arranged between the bending area BR and the touch electrodes. As an example, in a plan view, the touch electrodes may be arranged between the innermost edge of the trace region TR and the outermost edge of the trace region TR.

As another example, depending on the case, an end of the light-blocking material layer BM may coincide with the outermost boundary of the trace region TR in a plan view. As another example, in a plan view, an end of the light-blocking material layer BM may be arranged between an edge of the organic insulating layer OL and the outermost touch electrode of the touch electrodes. The outermost touch electrode may denote a touch electrode arranged closest to the bending area BR among the touch electrodes.

As shown in FIGS. 7 to 10, the light-blocking material layer BM may be arranged in the trace region TR. In a plan view, the light-blocking material layer BM may overlap the touch electrodes arranged in the trace region TR. As an example, the light-blocking material layer BM may cover the touch electrodes arranged in the trace region TR. As a result, a reflection of external light occurring due to the touch electrodes may be prevented.

Figure 11:
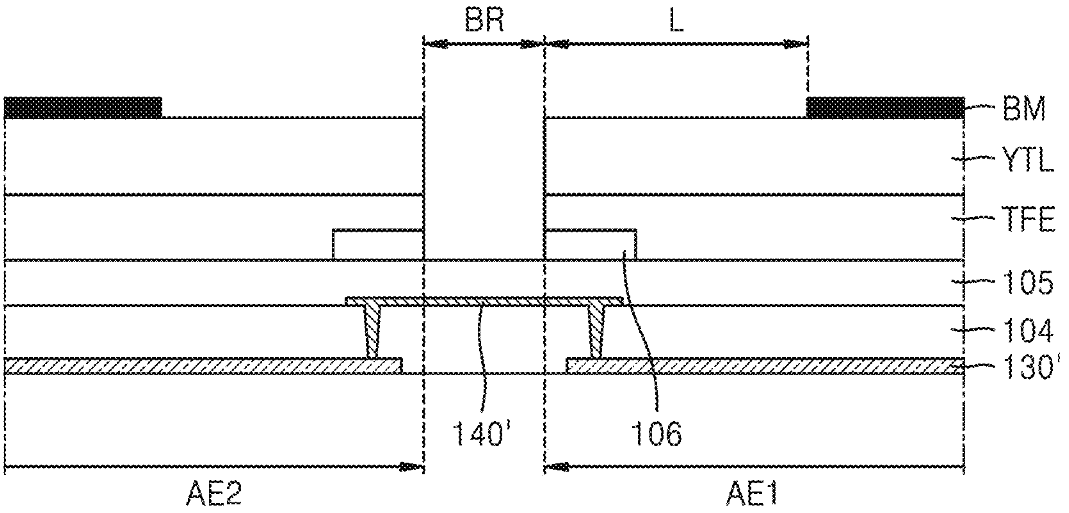
FIGS. 11 and 12 are schematic cross-sectional views of the vicinity of a bending area of FIG. 1 according to an embodiment.
Figure 12:
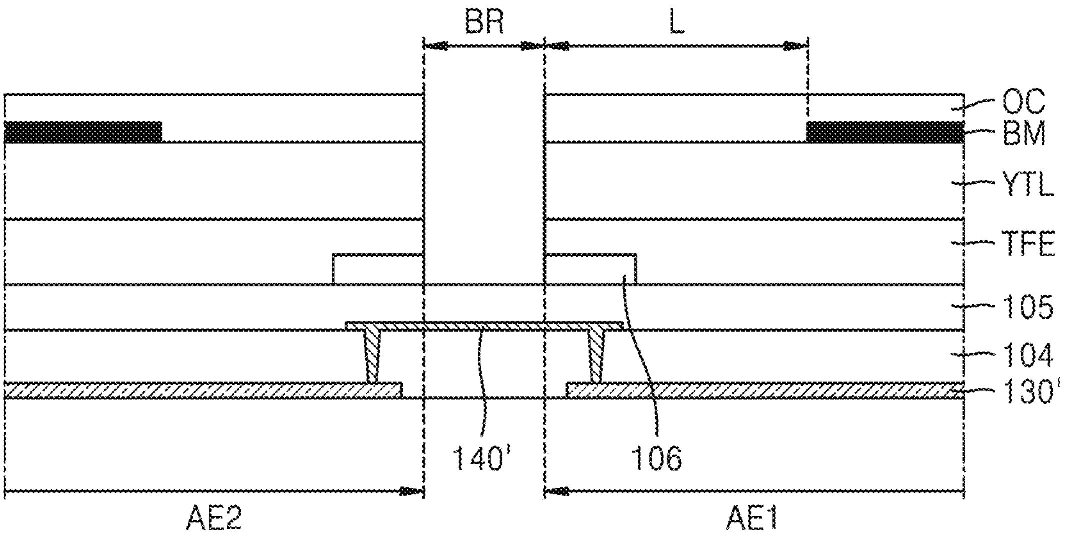

FIGS. 11 and 12 are schematic cross-sectional views of the vicinity of the bending area BR of FIG. 1. For reference, in the description of FIGS. 11 and 12, contents identical to or repeating those described above may be omitted.

For reference, although it may be shown in FIGS. 11 and 12 that the first organic insulating layer 104 and the second organic insulating layer 105 may be continuously formed over the main area AE1, the bending area BR, and the sub-region AE2, this may be schematically shown for convenience of description and drawing.

As shown in FIGS. 11 and 12, a wiring structure electrically connecting the main area AE1 and the sub-region AE2 through the bending area BR may be implemented through a first conductive layer 130' and a second conductive layer 140'. The first conductive layer 130' and the first conductive layer 130 may include a same material and have a same layered structure. The second conductive layer 140' and the second conductive layer 140 may include a same material and have a same layered structure.

Depending on the case, the second conductive layer 140' may form a bridge structure and may be electrically connected to the main area AE1 and the sub-area AE2 through the bending area BR using the bridge structure. In addition, the bridge structure may be omitted depending on a position in which the cross-sectional view may be drawn.

As shown in FIG. 11, in a plan view, an end of the light-blocking material layer BM may be apart from the inner surface (or the inner surface of the bending area BR) of the opening formed in the bending area BR by a first distance L. In other words, in a plan view, an end of the light-blocking material layer BM may be apart from the bending area BR by the first distance L.

The first distance L may be defined as a shortest distance among distances, in a plan view, from an edge in which the light-blocking material layer BM may be in contact with the touch electrode layer YTL (or an edge of a contact surface of the light-blocking material layer BM and the touch electrode layer YTL), to an inner surface (or an inner surface of the bending area BR) of an opening formed in at least one inorganic material layer (or multiple inorganic material layers) to form the bending area BR. For example, the first distance L may be defined as a length in a plan view.

More accurately, the first distance L may be defined as a shortest distance among distances, in a plan view, from an edge in which the light-blocking material layer BM may be in contact with the touch electrode layer YTL (or an edge of a contact surface of the light-blocking material layer BM and the touch electrode layer YTL), to an edge (or a boundary in which the bottom surface of the opening may be in contact with an inner surface of the opening) in which an inner surface (or an inner surface of the bending area BR) of the opening may be in contact with the upper surface of the substrate 100.

As an example, the first distance L may be about 400 μm or more. An effect for this numerical value may be shown in Table 1 below. The results of reliability evaluation in a high temperature/high humidity environment of about 85 degrees Celsius and about 85% humidity may be confirmed in table below.

TABLE 1

| first distance L | reliability evaluation in a high temperature/high humidity environment (THB about 85° C./about 85%) |
|---|---|
| about 0 μm | test panels: 6 sheets<br>disqualified panels: 3 sheets |
| about 350 μm | test panels: 6 sheets<br>disqualified panels: 1 sheet |
| about 400 μm | test panels: 6 sheets<br>disqualified panels: 0 sheet |
| about 950 μm | test panels: 6 sheets<br>disqualified panels: 0 sheet |

As shown in [Table 1], in case that the first distance L may be between about 0 μm to and about 350 μm, panels that did not pass the reliability evaluation occurred during the reliability evaluation. A panel disqualified in the reliability evaluation denotes a panel in which corrosion occurs in the bending area BR or moisture penetrates into the inside. Like this, in case that the first distance L may be about 400 μm or more, all panels passed the test during reliability evaluation in the high temperature/high humidity environment.

In the panels used in the test, a point at which the first distance L may be about 350 μm may be a point between the outer bank 240 and the first bank 210 in a plan view. For example, a point at which the first distance L may be about 350 μm overlaps the first valley structure VL1 in a plan view.

In the panels used in the test, a point at which the first distance L may be about 400 μm may be a point between the first bank 210 and the second bank 220 in a plan view. For example, a point at which the first distance L may be about 400 μm overlaps the second valley structure VL2 in a plan view.

However, in the display apparatus used in [Table 1], in the case where the first distance L may be 750 μm or more, at least one of the touch electrodes in the trace region TR may not be covered by the light-blocking material layer BM. Because light blocking may not be performed by the light-blocking material layer BM, a portion of external light may be reflected by the touch electrodes and may adversely influence the image quality of the display apparatus. In the panels used in the test, a point at which the first distance L may be about 950 μm may be a point in the trace region TR in a plan view. Accordingly, in the case where the first distance L may be about 950 μm, a defect due to water-soluble salt does not occur but a phenomenon that external light may be reflected by the touch electrodes occurs. As a result, the range of the first distance L may be about 400 μm or more and about 750 μm or less.

Like this, it was determined that the display apparatus according to an embodiment has high reliability in case that one of the requirements below may be met.

(1) The first distance L may be about 400 μm or more and about 750 μm or less.

(2) An end of the light-blocking material layer BM may be arranged between the first bank 210 and the second bank 220 in a plan view (the second valley structure VL2).

(3) An end of the light-blocking material layer BM may be arranged between the second bank 220 and the third bank 230 in a plan view (the third valley structure VL3).

(4) An end of the light-blocking material layer BM may be arranged between the third bank 230 and the organic insulating layer in a plan view (the fourth valley structure VL4).

As shown in FIG. 12, to improve the reliability of the display apparatus according to an embodiment under the high temperature/high humidity environment, the display apparatus may further include an overcoat layer OC on the light-blocking material layer BM.

The overcoat layer OC may cover the light-blocking material layer BM. The overcoat layer OC may not be arranged in the bending area BR. For example, the overcoat layer OC may include a through region corresponding to the bending area BR.

The overcoat layer OC may be disposed on the color filter CF to planarize the surface of the substrate 100 that becomes irregular by the color filter CF. The overcoat layer OC may include a material having excellent transmittance. As an example, the overcoat layer OC may include acryl, epoxy, cardo-based polymer, or a combination thereof. The overcoat layer OC may include a low-temperature curable material of about 90 °C or less to prevent thermal deterioration of the emission layers.

Like this, because the overcoat layer OC may be additionally arranged, leakage of a water-soluble salt component from the light-blocking material layer BM may be prevented. As a result, the reliability of the display apparatus according to an embodiment may be improved even more.

Figure 13:
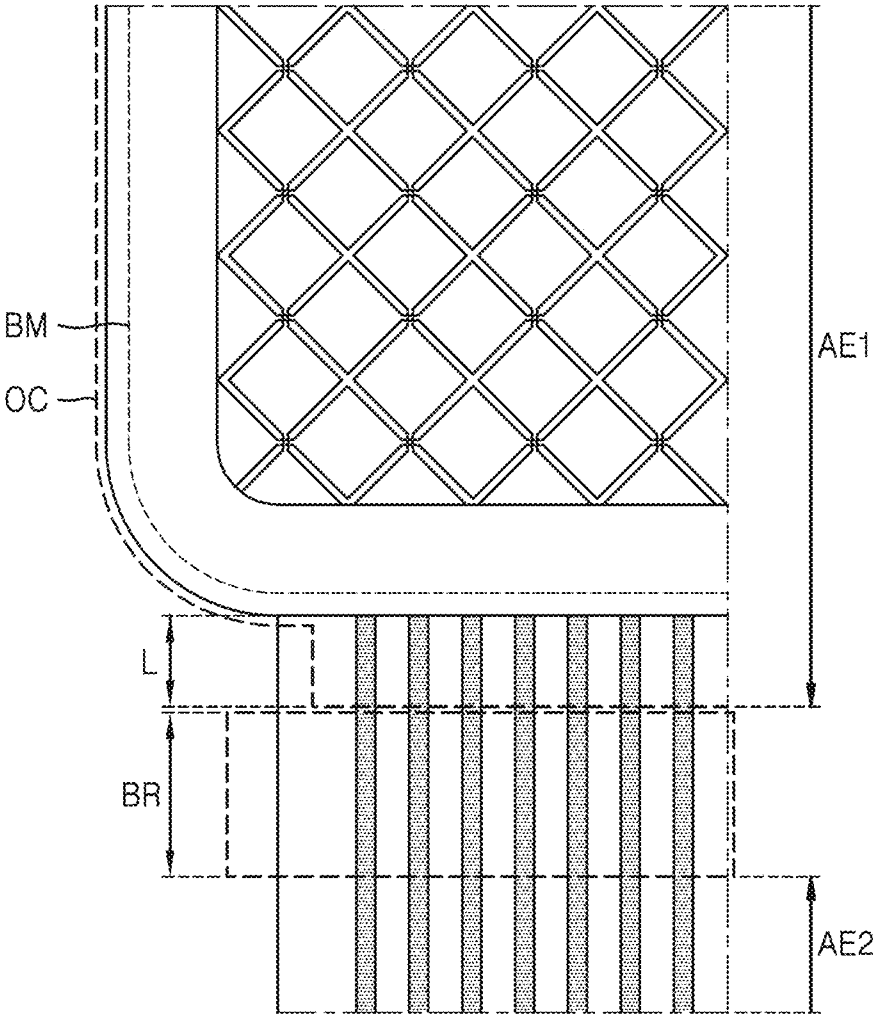
FIG. 13 is a schematic plan view of the vicinity of the bending area of FIG. 1 according to an embodiment.

FIG. 13 is a schematic plan view of the vicinity of the bending area BR of FIG. 1.

As shown in FIG. 13, in a plan view, the light-blocking material layer BM may be apart from the bending area BR by the first distance L. In addition, the overcoat layer OC may cover the light-blocking material layer BM. Descriptions of FIG. 13 may be replaced with the above descriptions.

The overcoat layer OC may be configured to block moisture penetrating from the lateral sides. The overcoat layer OC may be arranged in the main area AE1. Accordingly, moisture that may penetrate from the vicinity of the bending area BR may be prevented.

As shown in FIG. 13, the overcoat layer OC may cover the light-blocking layer BM entirely. For example, in a plan view, the area of the overcoat layer OC may be greater than the area of the light-blocking layer BM. Accordingly, moisture penetrating from the lateral sides of the light-blocking material layer BM may be blocked or prevented by the covering of the overcoat layer OC.

Figure 14:
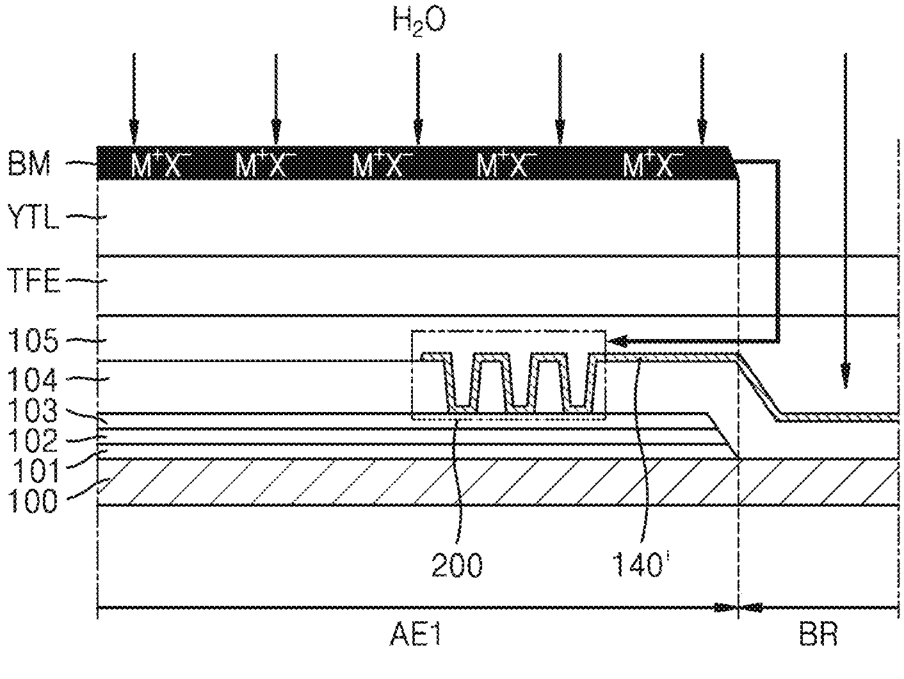
FIG. 14 is a schematic view for explaining a corrosion phenomenon occurring in the bending area of FIG. 1.
Figure 15:
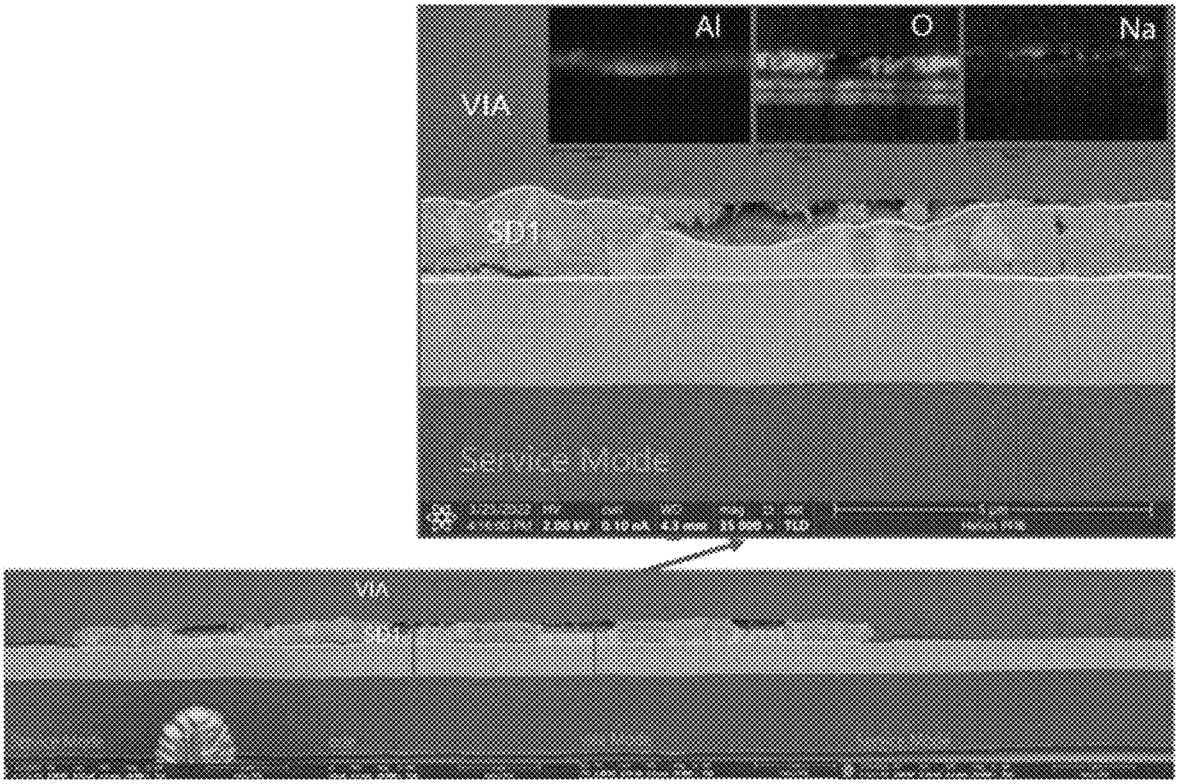
FIG. 15 is a photo showing a corrosion phenomenon occurring in the bending area of FIG. 1.

FIG. 14 is a schematic view for explaining a corrosion phenomenon occurring in the bending area of FIG. 1 and FIG. 15 is a photo showing a corrosion phenomenon occurring in the bending area of FIG. 1.

As shown in FIGS. 14 and 15, under the high temperature/high humidity conditions (e.g., temperature of about 85 degrees Celsius and humidity of about 85%), a water-soluble salt component included in the light-blocking material layer BM together with moisture may penetrate an inner wiring (e.g., the second conductive layer 140 and the like) through the bending area BR. A conductive material or the inner wiring, which may be a metallic material, may be readily corroded by the water-soluble component and moisture. Accordingly, to reduce or prevent the penetration of the water-soluble salt component included in the light-blocking material layer BM into the inner wiring through the bending area BR, one end of the light-blocking material layer BM needs to be apart from the bending area BR by a preset distance or more.

According to an embodiment, the display apparatus, in which corrosion occurring in the bending area may be reduced or prevented, may be implemented. However, the scope of the disclosure may not be limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate including a display area and a peripheral area disposed around the display area, wherein the peripheral area includes a bending area that is bent about a bending axis;

at least one inorganic material layer disposed on the substrate;

at least one organic material layer disposed on the at least one inorganic material layer;

a touch electrode layer disposed on the at least one organic material layer, the touch electrode layer including a plurality of touch electrodes arranged in the peripheral area;

at least one bank disposed on the at least one inorganic material layer, the at least one bank arranged between the bending area and the display area in a plan view; and a light-blocking material layer disposed above the touch electrode layer with respect to the substrate, the light-blocking material layer having an end arranged between the at least one bank and the plurality of touch electrodes in a plan view.

2. The display apparatus of claim 1, wherein the at least one bank includes:

a first bank arranged between the bending area and the plurality of touch electrodes in a plan view; and a second bank arranged between the first bank and the plurality of touch electrodes in a plan view, wherein the second bank is apart from the first bank.

3. The display apparatus of claim 2, wherein the end of the light-blocking material layer is arranged between the first bank and the second bank in a plan view.

4. The display apparatus of claim 3, wherein the light-blocking material layer covers the plurality of touch electrodes in a plan view.

5. The display apparatus of claim 2, wherein the at least one bank further includes a third bank arranged between the second bank and the plurality of touch electrodes, the third bank being apart from the second bank in a plan view.

6. The display apparatus of claim 5, wherein the end of the light-blocking material layer is arranged between the second bank and the third bank in a plan view.

7. The display apparatus of claim 6, wherein the light-blocking material layer overlaps the plurality of touch electrodes in a plan view.

8. The display apparatus of claim 1, wherein, in a plan view, a distance between an inner surface of the bending area and the end of the light-blocking material layer is in a range of about 400 μm to about 750 μm.

9. The display apparatus of claim 1, further comprising an outer bank arranged in the bending area, the outer bank filling an opening disposed in the bending area in a plan view, and the outer bank including an organic material.

10. The display apparatus of claim 1, wherein the light-blocking material layer includes a water-soluble salt.

11. The display apparatus of claim 10, wherein the water-soluble salt includes at least one of sodium, potassium, magnesium, manganese, aluminum, and calcium.

12. The display apparatus of claim 1, wherein the at least one organic material layer includes:

a first organic insulating layer disposed on the at least one inorganic material layer;

a second organic insulating layer disposed on the first organic insulating layer; and a pixel-defining layer disposed on the second organic insulating layer.

13. The display apparatus of claim 12, wherein the at least one bank includes:

a first bank arranged between the bending area and the plurality of touch electrodes in a plan view; and a second bank arranged between the first bank and the plurality of touch electrodes in a plan view, wherein the first bank includes:

a (1-1)st sub-bank disposed on the at least one inorganic material layer, the (1-1)st sub-bank and the first organic insulating layer including a same material;

a (1-2)nd sub-bank disposed on the (1-1)st sub-bank, the (1-2)nd sub-bank and the second organic insulating layer including a same material; and a (1-3)rd sub-bank disposed on the (1-2)nd sub-bank, the (1-3)rd sub-bank and the pixel-defining layer including a same material.

14. The display apparatus of claim 13, wherein the second bank includes:

a (2-1)st sub-bank disposed on the at least one inorganic material layer, the (2-1)st sub-bank and the second organic insulating layer including a same material; and a (2-2)nd sub-bank disposed on the (2-1)st sub-bank, the (2-2)nd sub-bank and the pixel-defining layer including a same material.

15. A display apparatus comprising:

a substrate including a display area and a peripheral area disposed around the display area, wherein the peripheral area includes a bending area that is bent about a bending axis;

a plurality of inorganic material layers disposed on the substrate, the plurality of inorganic material layers including a plurality of openings each arranged in the bending area and exposing an upper surface of the substrate;

a plurality of organic material layers disposed on the plurality of inorganic material layers, the plurality of organic material layers including a plurality of ends each arranged between the bending area and the display area in a plan view;

a touch electrode layer disposed on the plurality of organic material layers, the touch electrode layer including a plurality of touch electrodes disposed in the peripheral area;

an outer bank arranged in the bending area in a plan view, the outer bank including an organic material, wherein a portion of the outer bank fills the plurality of openings;

a first bank disposed on the plurality of inorganic material layers and arranged between the bending area and the display area in a plan view;

a second bank arranged between the first bank and the display area and apart from the first bank in a plan view; and a light-blocking material layer disposed above the touch electrode layer with respect to the substrate, the light-blocking material layer having a portion of an edge thereof arranged between the first bank and the display area in a plan view, wherein a lateral surface of the outer bank and a lateral surface of the first bank are arranged to face each other and define a first valley structure, another lateral surface of the first bank and a lateral surface of the second bank are arranged to face each other and define a second valley structure, and a portion of the edge of the light-blocking material layer overlaps the second valley structure in a plan view.

16. The display apparatus of claim 15, wherein the light-blocking material layer covers the plurality of touch electrodes in a plan view.

17. The display apparatus of claim 15, wherein the light-blocking material layer includes a water-soluble salt.

18. The display apparatus of claim 17, wherein the water-soluble salt includes at least one of sodium, potassium, magnesium, manganese, aluminum, and calcium.

19. A display apparatus comprising:

a substrate including a display area and a peripheral area disposed around the display area, wherein the peripheral area includes a bending area that is bent about a bending axis;

a plurality of inorganic material layers disposed on the substrate, the plurality of inorganic material layers including a plurality of openings each arranged in the bending area and exposing an upper surface of the substrate;

a plurality of organic material layers disposed on the plurality of inorganic material layers, the plurality of organic material layers including a plurality of ends each arranged between the bending area and the display area in a plan view;

a touch electrode layer disposed on the plurality of organic material layers and including a plurality of touch electrodes disposed in the peripheral area;

an outer bank arranged in the bending area in a plan view, and including an organic material, wherein a portion of the outer bank fills the plurality of openings;

a first bank disposed on the plurality of inorganic material layers and arranged between the bending area and the display area in a plan view;

a second bank arranged between the first bank and the display area and apart from the first bank;

a third bank arranged between the second bank and the display area and apart from the second bank; and a light-blocking material layer disposed above the touch electrode layer with respect to the substrate and arranged between the second bank and the display area in a plan view, wherein a lateral surface of the outer bank and a lateral surface of the first bank are arranged to face each other and define a first valley structure, another lateral surface of the first bank and a lateral surface of the second bank are arranged to face each other and define a second valley structure, another lateral surface of the second bank and a lateral surface of the third bank are arranged to face each other and define a third valley structure, and an end of the light-blocking material layer overlaps the third valley structure in a plan view.

20. The display apparatus of claim 19, wherein the light-blocking material layer covers the plurality of touch electrodes in a plan view.

* * * * *